US008514590B2

(12) United States Patent
Nakasaka et al.

(10) Patent No.: US 8,514,590 B2
(45) Date of Patent: Aug. 20, 2013

(54) POWER CONVERSION APPARATUS

(75) Inventors: Akira Nakasaka, Anjo (JP); Masaru Miyazaki, Kasugai (JP); Kenichi Oohama, Ichinomiya (JP)

(73) Assignee: Denso Corporation, Kariya (JP)

( * ) Notice: Subject to any disclaimer, the term of this patent is extended or adjusted under 35 U.S.C. 154(b) by 221 days.

(21) Appl. No.: 13/021,931

(22) Filed: Feb. 7, 2011

(65) Prior Publication Data

US 2011/0194248 A1 Aug. 11, 2011

(30) Foreign Application Priority Data

Feb. 5, 2010 (JP) ................................. 2010-024557
Oct. 29, 2010 (JP) ................................. 2010-244592

(51) Int. Cl.
*H02B 1/01* (2006.01)

(52) U.S. Cl.
USPC ........... 361/831; 361/688; 361/689; 361/690; 361/691; 361/692; 361/693; 361/694; 361/698; 361/699; 361/704; 361/809; 361/810; 361/825; 361/829; 361/830

(58) Field of Classification Search
USPC ................. 361/688–704, 809, 810, 825, 829, 361/830, 831
See application file for complete search history.

(56) References Cited

U.S. PATENT DOCUMENTS

| 5,258,888 A | 11/1993 | Korinsky |
| 5,497,289 A | 3/1996 | Sugishima et al. |
| 5,631,821 A | 5/1997 | Muso |
| 6,166,937 A | 12/2000 | Yamamura et al. |
| 7,248,478 B2 | 7/2007 | Inoue |
| 7,542,318 B2 | 6/2009 | Otsuka et al. |
| 7,663,886 B2 | 2/2010 | Aoki et al. |
| 8,149,577 B2 | 4/2012 | Tang et al. |
| 8,189,324 B2 | 5/2012 | Folts |

(Continued)

FOREIGN PATENT DOCUMENTS

| CN | 1906840 | 1/2007 |
| JP | 2002-043782 | 2/2002 |

(Continued)

OTHER PUBLICATIONS

Japanese Office Action dated Jun. 26, 2012, issued in corresponding Japanese Application No. 2010-244592, with English translation.

(Continued)

*Primary Examiner* — Hung S Bui
*Assistant Examiner* — James Wu
(74) *Attorney, Agent, or Firm* — Nixon & Vanderhye P.C.

(57) ABSTRACT

The power conversion apparatus includes electronic components constituting a power conversion circuit, a cooler for cooling at least some of the electronic components, and a case housing the electronic components and the cooler. The at least some of the electronic components and the cooler are fixed to and integrated in a frame as an internal unit. The internal unit including therein the semiconductor modules also includes a control circuit board fitted to board fixing sections formed in the frame so as to project from the frame in the height direction perpendicular to the plane of the frame. Each of the board fixing sections has a board abutment surface at a position closer to the frame than the tips of control terminals of the semiconductor modules formed so as to project in the height direction.

7 Claims, 33 Drawing Sheets

(56) References Cited

U.S. PATENT DOCUMENTS

| | | |
|---|---|---|
| 8,213,179 B2 | 7/2012 | Yoshida et al. |
| 2006/0096299 A1* | 5/2006 | Mamitsu et al. ............... 62/3.2 |
| 2006/0232939 A1 | 10/2006 | Inoue |
| 2006/0243422 A1 | 11/2006 | Sakai et al. |
| 2007/0002594 A1 | 1/2007 | Otsuka et al. |
| 2007/0076355 A1 | 4/2007 | Oohama |
| 2007/0165376 A1* | 7/2007 | Bones et al. ................. 361/688 |
| 2007/0215316 A1* | 9/2007 | Saito et al. ..................... 165/41 |
| 2007/0295715 A1* | 12/2007 | Saka et al. ................... 219/624 |
| 2008/0158824 A1 | 7/2008 | Aoki et al. |
| 2009/0040724 A1 | 2/2009 | Nishikimi et al. |
| 2009/0241575 A1 | 10/2009 | Jadric et al. |
| 2009/0251859 A1 | 10/2009 | Harada et al. |
| 2011/0194246 A1 | 8/2011 | Nakasaka et al. |
| 2011/0194247 A1 | 8/2011 | Nakasaka et al. |
| 2011/0194249 A1 | 8/2011 | Nakasaka et al. |
| 2011/0194322 A1 | 8/2011 | Nakasaka et al. |
| 2012/0039039 A1 | 2/2012 | Nishikimi et al. |
| 2012/0170217 A1 | 7/2012 | Nishikimi et al. |

FOREIGN PATENT DOCUMENTS

| | | |
|---|---|---|
| JP | P2006-174572 A | 6/2006 |
| JP | P2007-014085 A | 1/2007 |
| JP | P2007-036214 A | 2/2007 |
| JP | P2008-166358 A | 7/2008 |
| JP | 4225310 | 12/2008 |
| JP | 2009-044891 | 2/2009 |
| JP | 2009-130964 | 6/2009 |
| JP | 2009-159767 | 7/2009 |
| JP | 2009-261125 | 11/2009 |
| JP | P2009-266986 A | 11/2009 |

OTHER PUBLICATIONS

Japanese Office Action dated Jun. 26, 2012, issued in corresponding Japanese Application No. 2010-244595, with English translation.
Office Action dated Dec. 10, 2012 in related U.S. Appl. No. 13/021,926.
Nakasaka et al, U.S. Appl. No. 13/021,926, filed Feb. 7, 2011.
Nakasaka et al, U.S. Appl. No. 13/021,937, filed Feb. 7, 2011.
Nakasaka et al, U.S. Appl. No. 13/021,934, filed Feb. 7, 2011.
Nakasaka et al, U.S. Appl. No. 13/021,948, filed Feb. 7, 2011.
Japanese Office Action dated Jan. 10, 2012, issued in corresponding Japanese Application No. 2010-244594, with English translation.
Official Action dated Aug. 6, 2012, issued in copending U.S. Appl. No. 13/021,934 of Nakasaka, filed Feb. 7, 2011.
Official Action dated Aug. 1, 2012, issued in copending U.S. Appl. No. 13/021,948 of Nakasaka, filed Feb. 7, 2011.
Office Action (2 pages) dated Jan. 8, 2013 issued in corresponding Japanese Application No. 2010-244592 and English translation (2 pages).
Office Action issued in Japanese Patent Appl. No. 2010-244595 on Jan. 8, 2013, with an English Language Translation.
Office Action issued Feb. 8, 2013 in co-pending U.S. Appl. No. 13/021,934.
Office Action issued Mar. 28, 2013 in co-pending U.S. Appl. No. 13/021,937.
Office Action issued Feb. 7, 2013 in co-pending U.S. Appl. No. 13/021,948.
Office Action issued in Chinese Patent Appl. 201110036400.4 on Mar. 18, 2013 along with English Language Translation.
Office Action issued in U.S. Appl. No. 13/021,934 on May 23, 2013.
Office Action issued in U.S. Appl. No. 13/021,948 on May 23, 2013.

\* cited by examiner

POWER CONVERSION APPARATUS

This application claims priority to Japanese Patent Applications No. 2010-244592 filed on Oct. 29, 2010, and No. 2010-24557 filed on Feb. 5, 2010, the entire contents of which are hereby incorporated by reference.

BACKGROUND OF THE INVENTION

1. Field of the Invention

The present invention relates to a power conversion apparatus in which electronic components constituting a power conversion circuit and a cooler for cooling at least some of the electronic components are housed in its case.

2. Description of Related Art

An electric vehicle or a hybrid vehicle is equipped with a power conversion apparatus such as an inverter or a converter to convert source power into driving power for a drive motor. As shown in FIG. 35, such a power conversion apparatus 9 includes various electronic components including semiconductor modules 921 each incorporating therein switching elements, and a capacitor 922. For example, refer to Japanese patent Application Laid-Open No. 2009-159767. To prevent the temperature of the semiconductor modules 921 from increasing excessively, a cooler 93 is disposed in contact with the semiconductor modules 921.

The power conversion apparatus 9 further includes a control circuit board 96 on which a control circuit for controlling the semiconductor modules 921 is formed. The electronic components including the semiconductor modules 921, the cooler 93 and the control circuit board 96 are fixed to a case 94, and sealed within the case 94.

Accordingly, if the case 94 is not rigid enough, the electronic components and the control circuit board 96 fixed to the case 94 may vibrate considerably, causing wire breakage, or failure in the electronic components due to external force applied thereto.

When the power conversion apparatus 9 is located in an engine compartment of a vehicle, the case 94 may expand or contract considerably due to abrupt temperature change. In this case, since the components are fixed directly to the case 94, they may fail due to thermal stress applied to them.

The case 94 of the power conversion apparatus 9 is constituted of a case body 940, and bottom and top lids 941 and 942. Accordingly, the case 94 has two large sealing surfaces required to be water-tight. Accordingly, since the case 94 has to be provided with many sealing members, the power conversion apparatus 9 is disadvantageous in the manufacturing cost.

In addition, the maintainability of the power conversion apparatus 9 is not good enough in this case, because both the bottom lid 941 and the top lid 942 have to be removed for maintenance work. It might be possible that the case 94 has only one sealing surface, if the case 94 is constituted of a bottomed case body and a top lid. However, in this case, the maintainability and rigidity of the case 94 may become worse.

Further, since vibration of the electronic components directly fixed to the case 94 can transmit to a vehicle body through the case 94, unpleasant vibration sound may occur in the vehicle cabin. Conversely, since vibration of the engine can transmit to the electronic components and the control circuit board through the case 94, wire breakage or fault may occur.

Incidentally, to mount the power conversion apparatus on a vehicle, it is necessary to change its external shape on a vehicle type to vehicle type basis, because the position of connecting means of the power conversion apparatus for connection with external devices has to be adjusted depending on the shape and structure of a space (engine compartment, for example) in which the power conversion apparatus is disposed. Accordingly, the power conversion apparatus of the type in which the electronic components and the cooler are directly assembled to the case needs to be changed in its internal layout. This makes it difficult to improve the productivity, and to prevent reducing the manufacturing cost.

SUMMARY OF THE INVENTION

The present invention provides a power conversion apparatus comprising:
  electronic components constituting a power conversion circuit;
  a cooler for cooling at least some of the electronic components; and
  a case housing the electronic components and the cooler;
  wherein
  the at least some of the electronic components and the cooler are fixed to and integrated in a frame as an internal unit,
  the internal unit is fixed within the case through the frame,
  the frame has such a shape that at least some of the electronic components constituting the internal unit are disposed inside the frame,
  the internal unit includes, as the at least some of the electronic components constituting the internal unit disposed inside the frame, semiconductor modules each incorporating switching elements and provided with control terminals through which control currents to control the switching elements are inputted and a control circuit board for generating the control currents,
  the cooler includes therein coolant passages,
  the internal unit further includes a stacked body of the coolant passages and the semiconductor modules,
  the coolant passages and the semiconductor modules being stacked alternately in the stacked body in a stacking direction parallel to a plane of the frame,
  the control terminals have a shape projecting in a height direction perpendicular to the stacking direction and the plane of the frame,
  the frame is provided with board fixing sections to which the control circuit board is fixed, the board fixing sections projecting in a direction of projection of the control terminals, and
  each of the board fixing sections has a board abutment surface for abutment with the control circuit board at a position closer to the frame in the height direction than tips of the control terminals.

The present invention also provides a power conversion apparatus comprising:
  electronic components constituting a power conversion circuit;
  a cooler for cooling at least some of the electronic components; and
  a case housing the electronic components and the cooler;
  wherein
  the at least some of the electronic components and the cooler are fixed to and integrated in a frame as an internal unit,
  the internal unit is fixed within the case through the frame,
  the frame has such a shape that at least some of the electronic components constituting the internal unit are disposed inside the frame,
  the internal unit includes, as the at least some of the electronic components constituting the internal unit disposed inside the frame, semiconductor modules each incorporating switching elements and provided with control terminals through which control currents to control the switching elements are inputted and a control circuit board for generating the control currents, and the frame includes unit fixing sections for fixing the internal unit to the case, the unit fixing sections being located outward of an outer edge of the control circuit board.

According to the present invention, there is provided, at a low cost, a power conversion apparatus which has a case rigid enough to significantly reduce external force applied to electronic components accommodated in the case, and is excellent in maintainability.

Other advantages and features of the invention will become apparent from the following description including the drawings and claims.

BRIEF DESCRIPTION OF THE DRAWINGS

In the accompanying drawings:

FIG. 34 is a plan view of the internal unit assembled with the control circuit board of the third embodiment; and.

PREFERRED EMBODIMENTS OF THE INVENTION

First Embodiment

Figure 1:
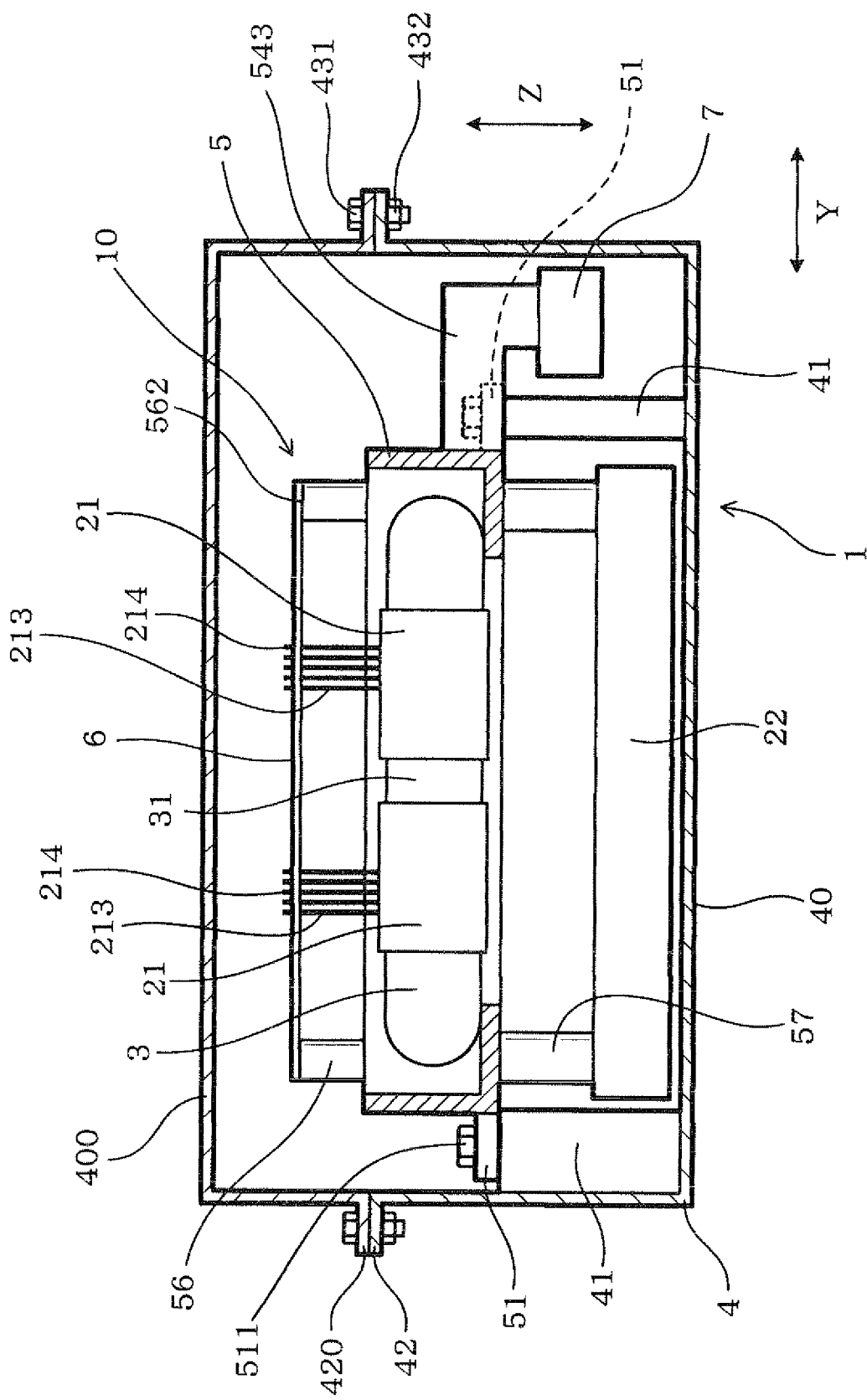
FIG. 1 is a schematic explanatory sectional view of a power conversion apparatus according to a first embodiment of the invention.

A power conversion apparatus 1 according to a first embodiment of the invention is described with reference to FIGS. 1 to 19. As shown in FIG. 1, the power conversion apparatus 1 of this embodiment is constituted of electronic components including semiconductor modules 21 and a capacitor 22, a cooler 3 for cooling at least some of the electronic components (the semiconductor modules 21 in this embodiment), and a case 4 housing the electronic components and the cooler 3. The semiconductor modules 21 and the cooler 3 are fixed to and integrated with a frame 5 to constitute an internal unit 10. The internal unit 10 is fixed to the case 4, and sealingly enclosed within the case 4.

Figure 16:
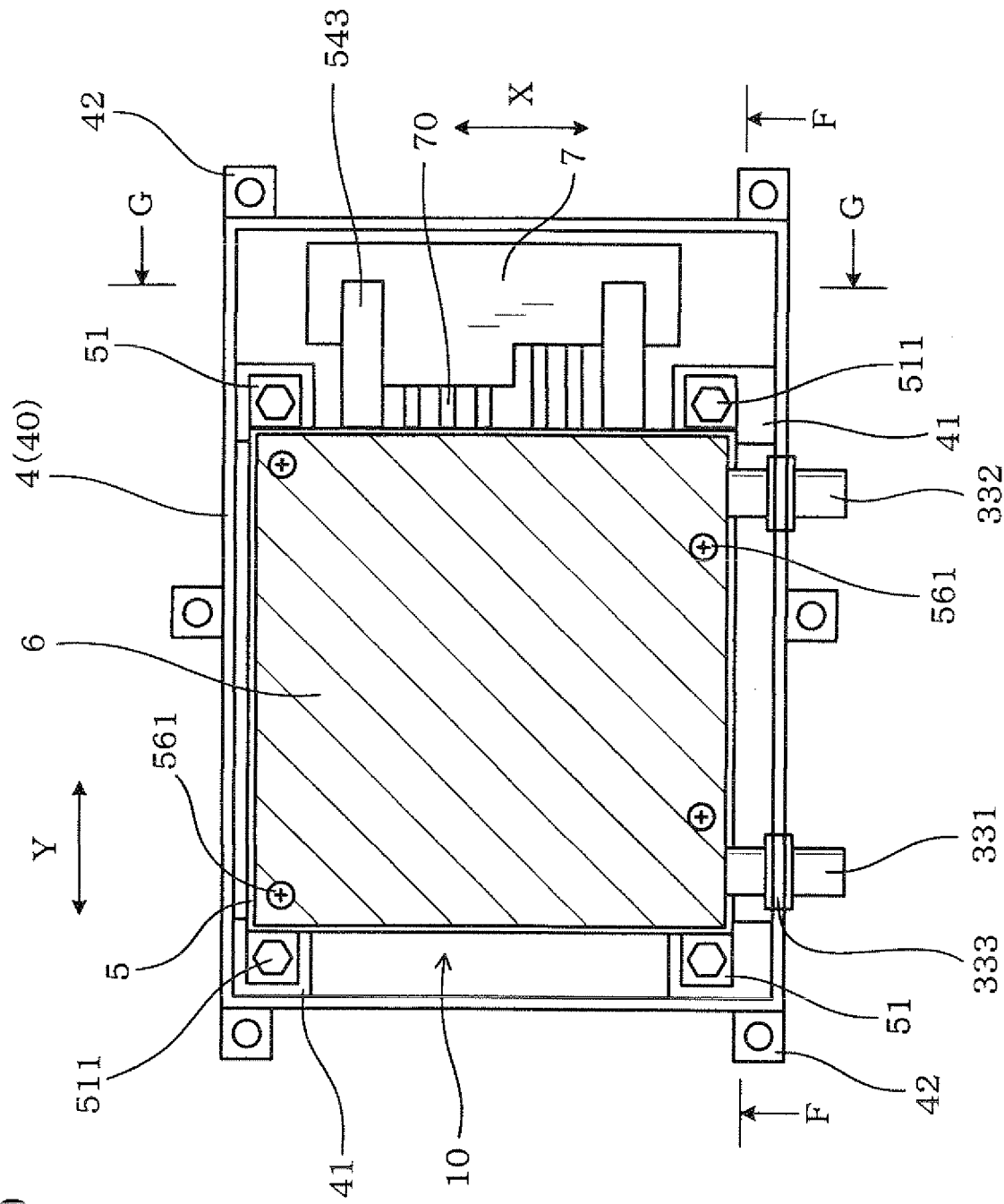
FIG. 16 is a plan view of the internal unit housed in a case of the first embodiment.
Figure 17:
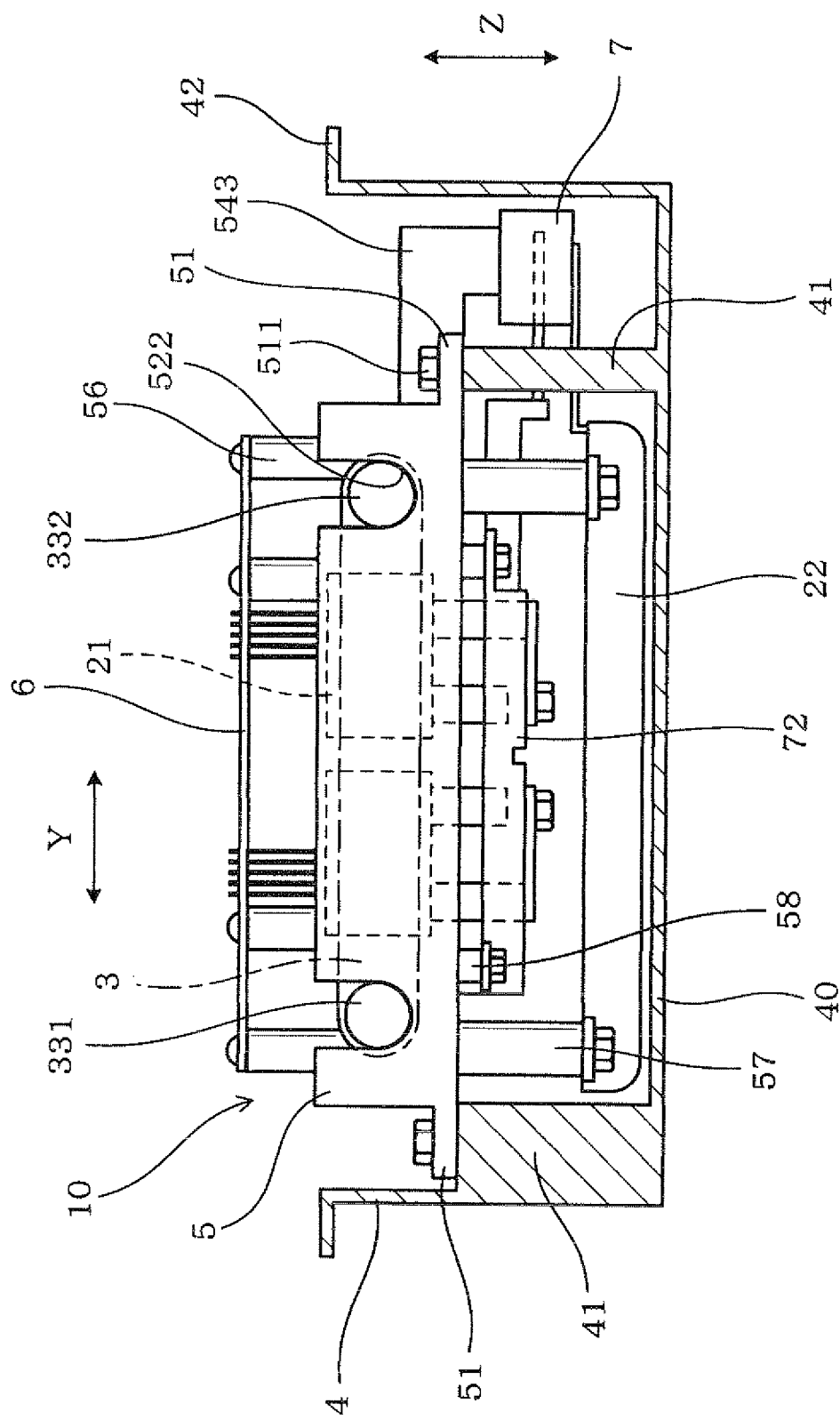
FIG. 17 is a cross-sectional view of FIG. 16 along the line F-F.
Figure 18:
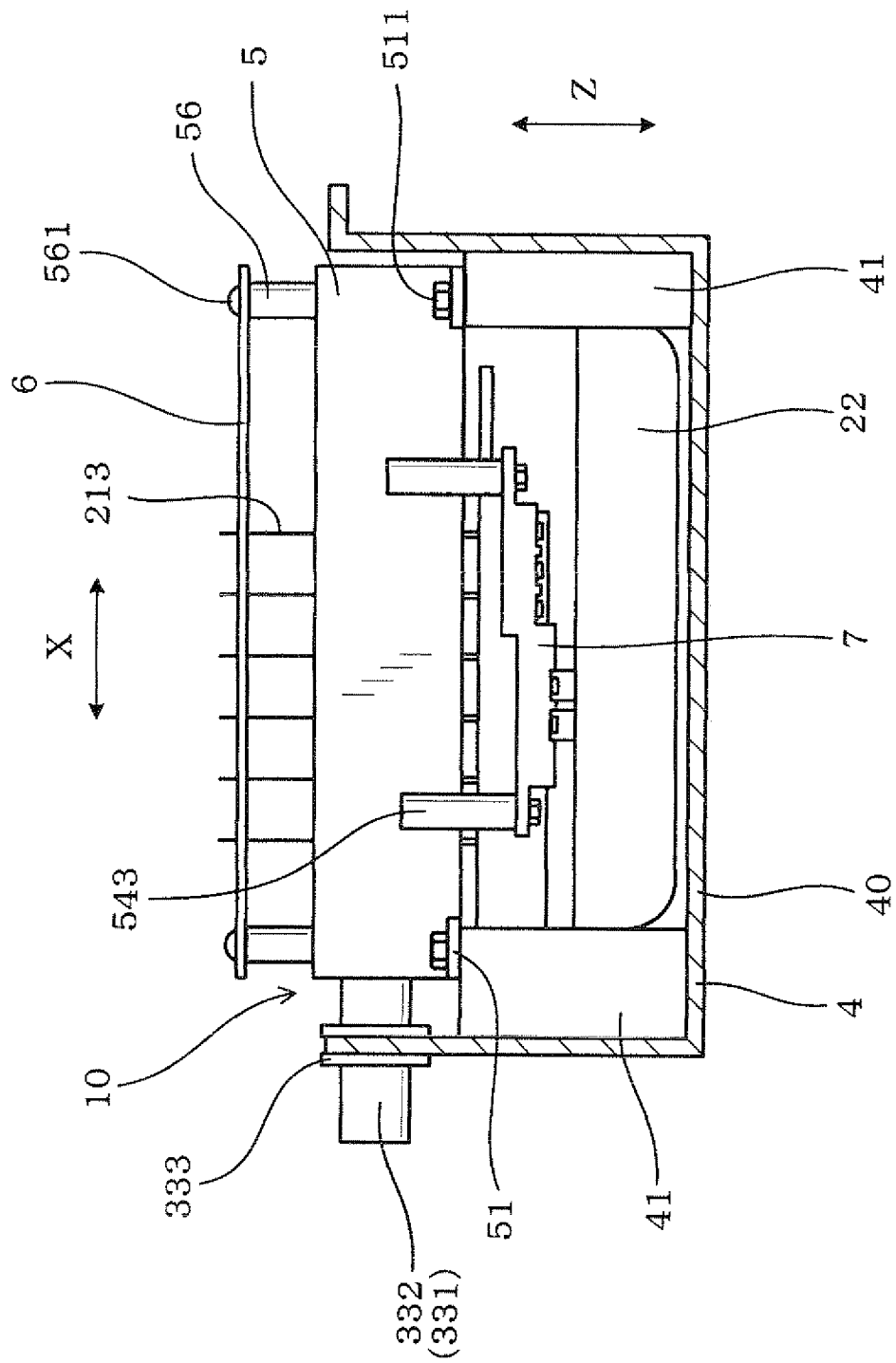
FIG. 18 is a cross-sectional view of FIG. 16 along the line G-G.

As shown in FIGS. 16 to 18, the internal unit 10 is fixed to the case 4 through the frame 5. The frame 5 is made of conductive material, and formed in a shape to surround the semiconductor modules 21 constituting the internal unit 10 from all four sides. The frame 5 may be a shaped body of metal such as aluminum or steel, or alloy. Also, the case 4 may be a shaped body of metal such as aluminum or steel or alloy.

Each of the semiconductor modules 21 incorporates therein switching elements such as IGBTs or MOSFETs. The semiconductor modules 21 are each constituted of a main body section 210 in which the switching elements are resin-molded, main electrode terminals 212 and control terminals 213. The main electrode terminals 212 and the control terminals 213 extend from the main body section 210 in the opposite directions. Controlled electric power is inputted to or outputted from each of the semiconductor modules 21 through the main electrode terminals 212. A control current to control the switching elements is inputted to each of the semiconductor modules 21 through the control terminals 213.

Figure 7:
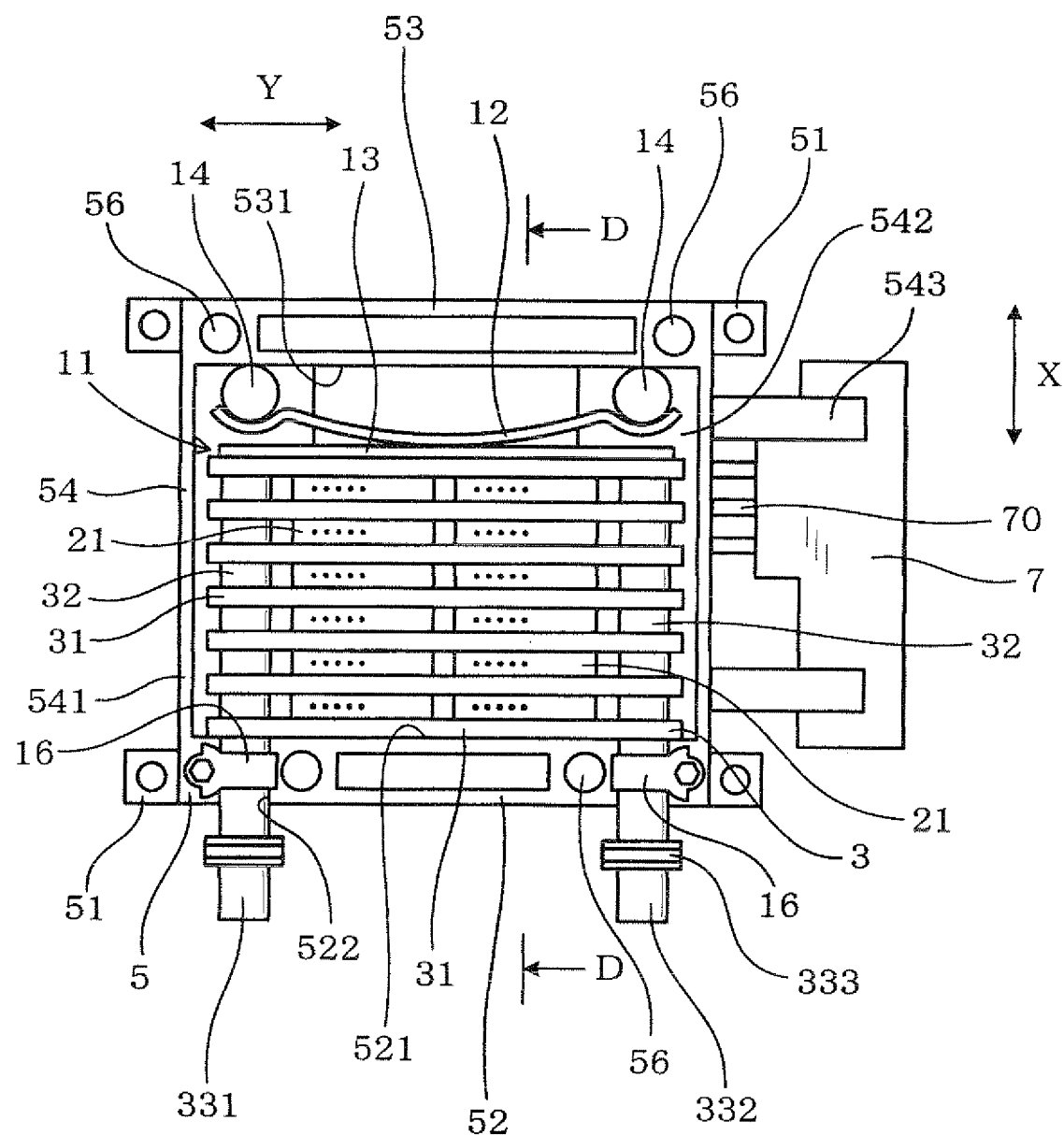
FIG. 7 is a plan view of the frame of the first embodiment, on which a stacked body, a terminal block and so forth are assembled.
Figure 10:
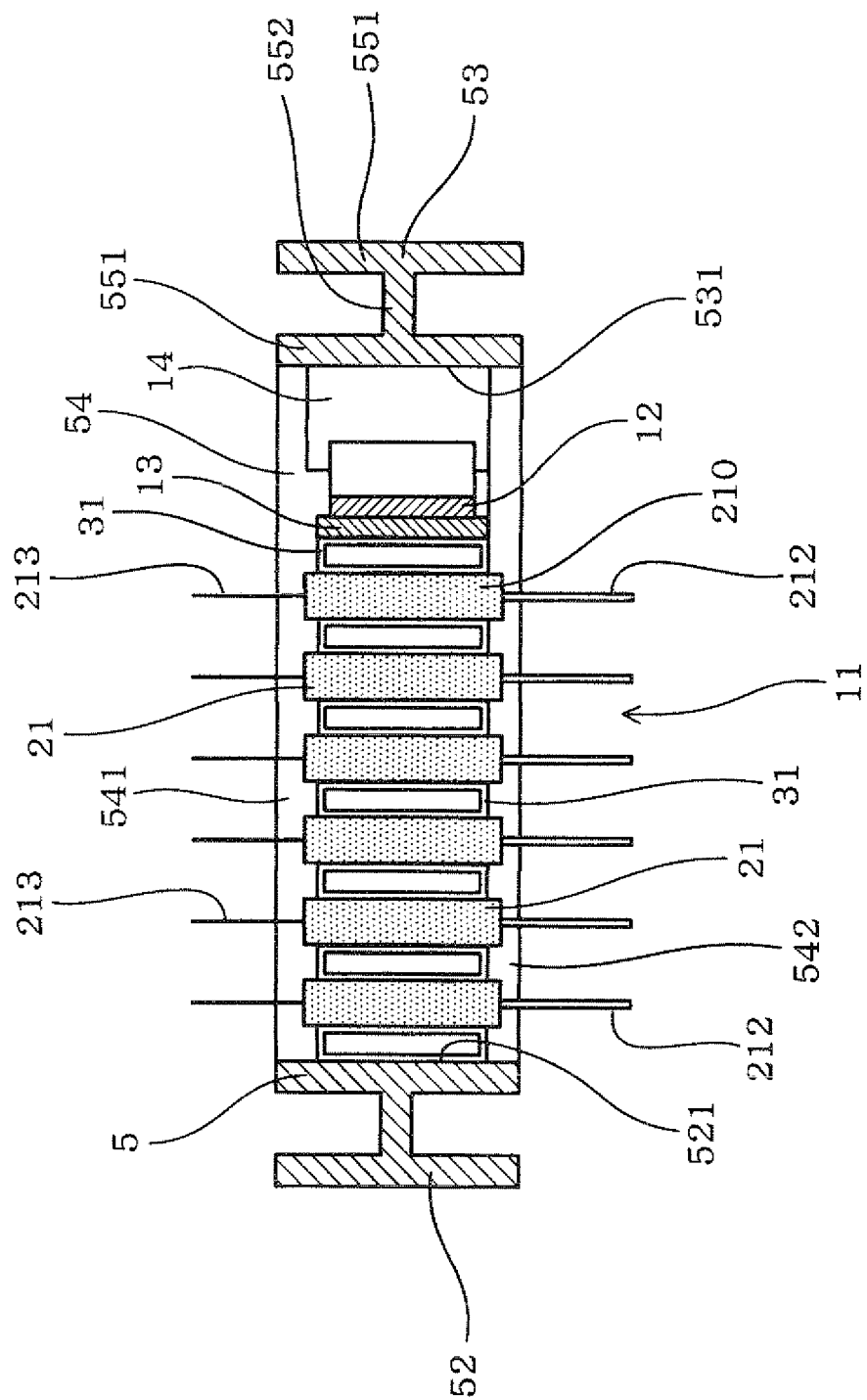
FIG. 10 is a cross-sectional view of FIG. 7 along the line D-D.

As shown in FIGS. 7 and 10, the cooler 3 includes cooling tubes 31 each having therein a coolant passage. The internal unit 10 incorporates therein a stacked body 11 in which the cooling tubes 31 and the semiconductor modules 21 are stacked alternately. Each of the semiconductor modules 21 is held between the cooling tubes 31 at both major surfaces thereof. Between each adjacent two of the cooling tubes 31, two semiconductor modules 21 are disposed.

As shown in FIG. 7, the cooling tubes 31 extend in their longitudinal direction (may be referred to as "the lateral direction Y") perpendicular to the stacking direction X. Each adjacent two of the cooling tubes 31 are joined through a deformable joint tube 32 at their both ends. The cooler 3 includes a coolant introduction tube 331 connected to one end in the lateral direction Y of the cooling tube 31 located at one end in the stacking direction X of the stacked body 11, and a coolant discharge tube 332 connected to the cooling tube 31 located at the other end in the stacking direction X of the stacked body 11.

Accordingly, the coolant introduced from the coolant introduction tube 331 spreads in the longitudinal direction (lateral direction Y), while passing the joint tubes 32 to be distributed to the respective cooling tubes 31. The coolant exchanges heat with the semiconductor modules 21 while flowing through the respective cooling tubes 31. The coolant having a temperature increased by the heat exchange passes the joint tubes 32 on the downstream side, and is discharged from the coolant discharge tube 332.

As the coolant, there may be used a natural coolant such as water and ammonia, or water mixed with refrigerant such as ethylene glycol, or a fluorocarbon coolant such as fluorinert, or a chlorofluorocarbon coolant such as HCFC123 and HFC134a, or an alcoholic coolant such as methanol and alcohol, or a ketone coolant such as acetone.

The internal unit 10 includes a pressure member 12 for pressing the stacked body 11 in the stacking direction X. The pressure member 12 is interposed between an inner part of the frame 5 and one end of the stacked body 11 (this one end being referred to as "rear end" hereinafter) in the stacking direction X. The stacked body 11 is supported by another inner part of the frame 5 at the other end thereof (referred to as "front end" hereinafter).

The pressure member 12 is constituted of a leaf spring which bents convexly toward the stacked body 11. Between the pressure member 12 and the stacked body 11, a flat reinforcing plate 13 is interposed to prevent the pressing force of the pressure member 12 from being locally applied to the cooling tube 31 located at the rear end to thereby prevent this cooling tube 31 from being deformed. A support pin 14 is held between each of both ends of the pressure member 12 in the lateral direction Y and the frame 5. The pressure member 12 is supported by the pair of the support pins 14 at its rear side.

Figure 2:
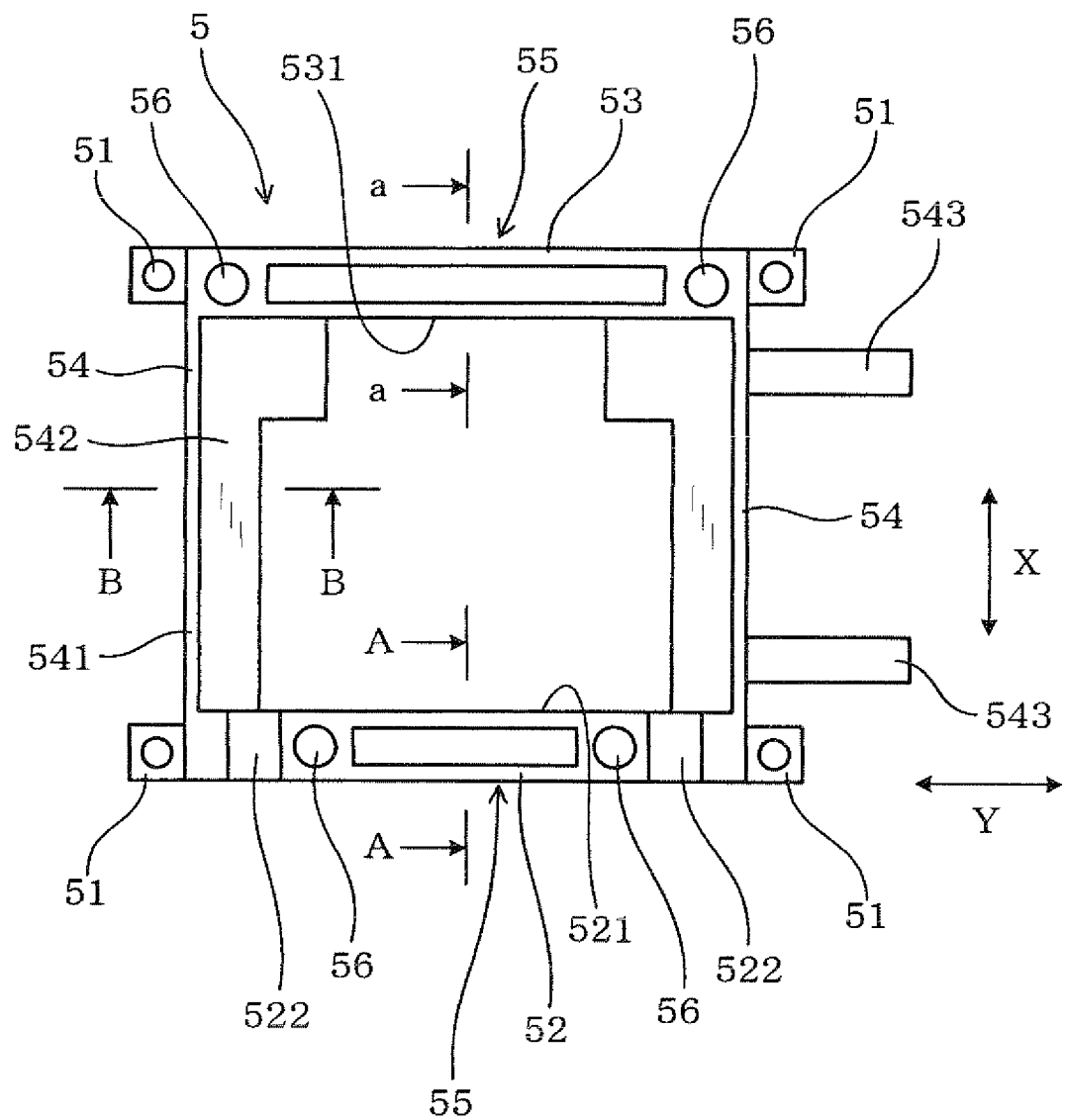
FIG. 2 is a plan view of a frame of the power conversion apparatus according to the first embodiment of the invention.
Figure 3:
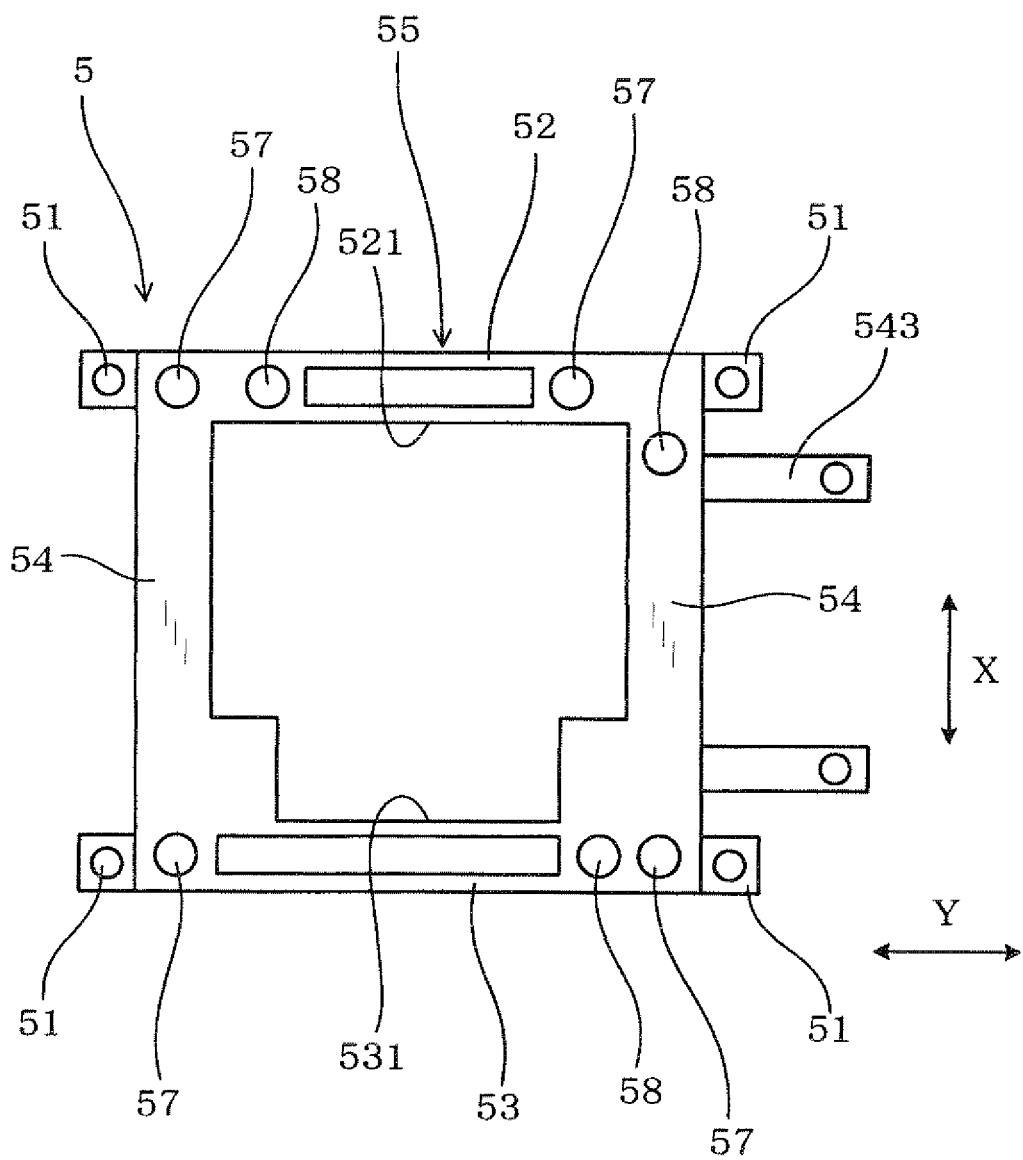
FIG. 3 is a bottom view of the frame shown in FIG. 2.

The frame 5 includes a front wall section 52 and a rear wall section 53 located on both sides of the stacked body 11 in the stacking direction X, and a pair of side wall sections 54 joining the front and rear wall sections 52 and 53 at their both ends. Hence, as shown in FIGS. 2 and 3, the frame 5 has a substantially rectangular shape when viewed from the direction perpendicular to both the stacking direction. X and the lateral direction Y (referred to as "height direction Z" hereinafter).

As show in FIGS. 1 to 3 and 19, the frame 5 includes unit fixing sections 51 for fixing the internal unit 10 to the case 4. At least one fixing section 54 is located on the outside of each of a pair of support sections (the inner surface 521 of the front wall section 52 and the inner surface 531 of the rear wall section 53) in the stacking direction X at which the frame 5 is applied with the reaction force toward the outside in the stacking direction X applied from the stacked body 11 and the pressure member 12. In this embodiment, two unit fixing sections 51 are located on the outside of the inner surface 521, and another two fixing sections 54 are located on the outside of the inner surface 531.

Each unit fixing section 51 is shaped to project outward from the frame 5 and is formed with a through hole. By inserting a bolt 511 into the through hole, and screwing the bolt 511 into a threaded hole formed in a corresponding one of unit support sections 41 formed inside the case 4 for each of the unit fixing sections 41, the frame 5 can be fixed to the case 4 to thereby fix the internal unit 10 to the case 4.

Figure 4:
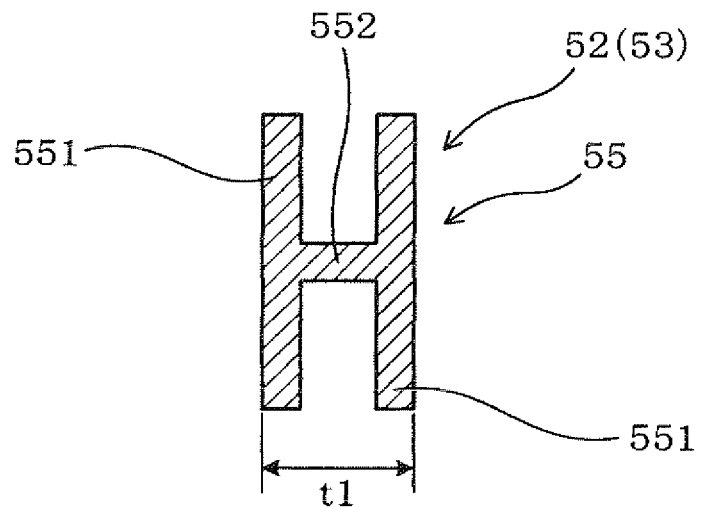
FIG. 4 is a cross-sectional view of FIG. 2 along the line A-A (or a-a)
Figure 5:
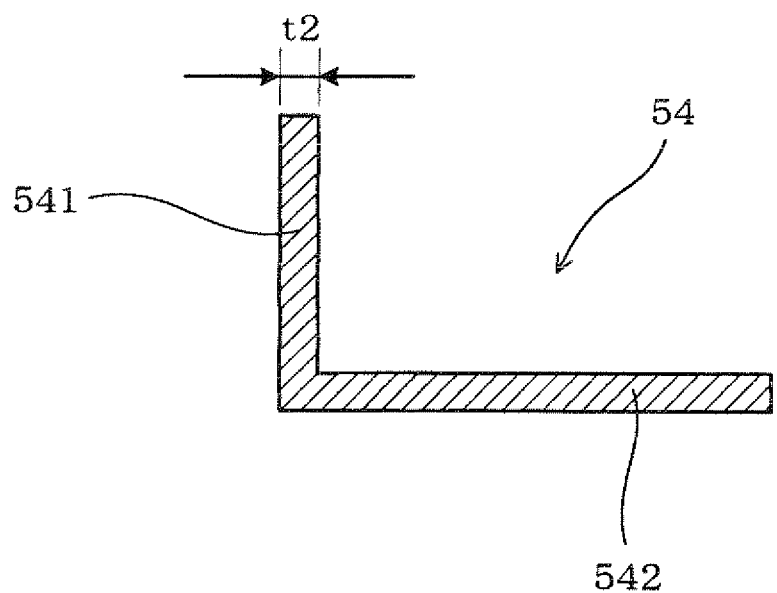
FIG. 5 is a cross-sectional view of FIG. 2 along the line B-B.
Figure 6:
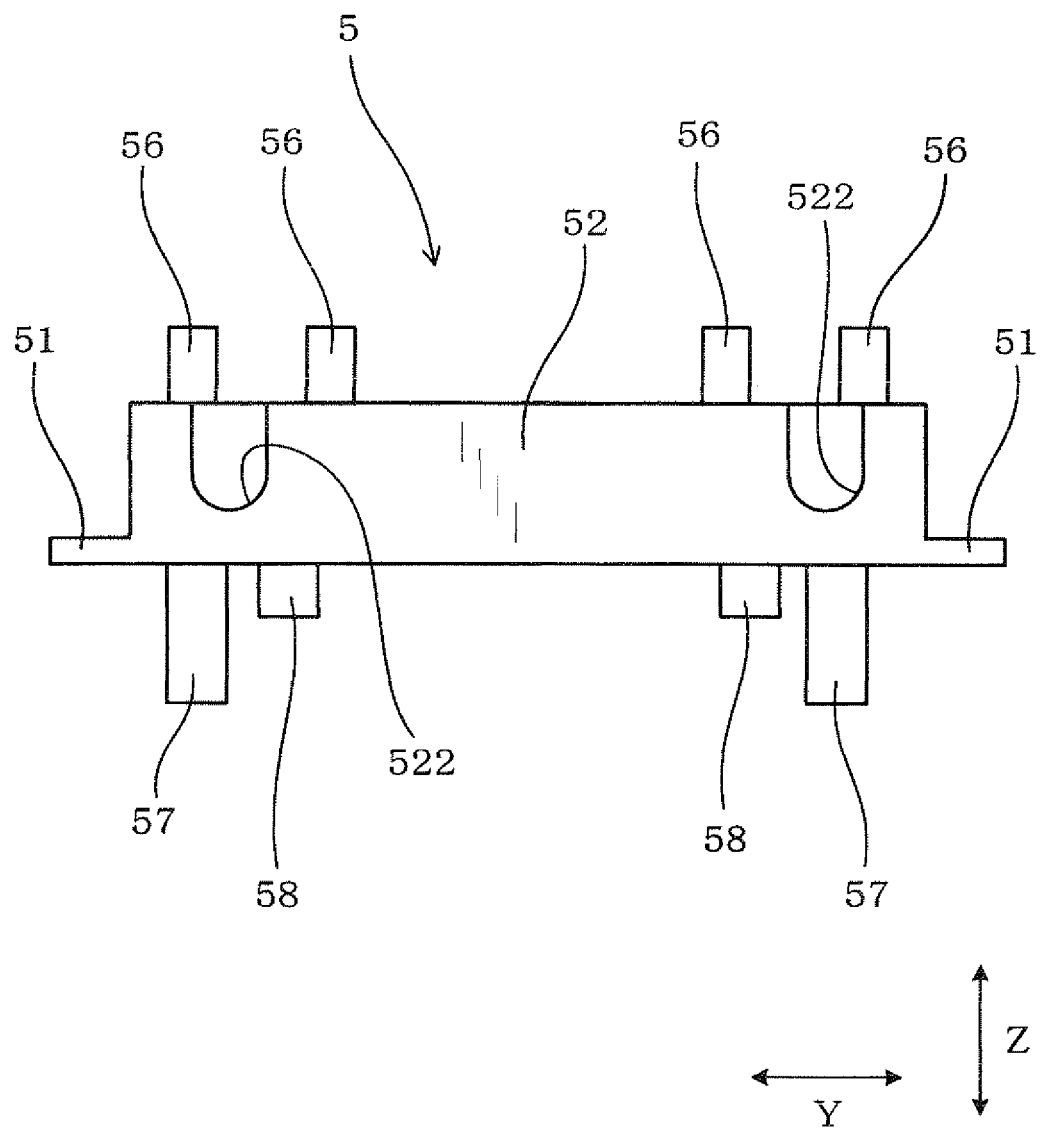
FIG. 6 is a front view of the frame of the first embodiment.

As shown in FIGS. 2, 4 and 5, the wall thickness t1 of the front wall section 52 and the rear wall section 53 are larger than the wall thickness t2 of the side wall section 54. Here, the wall thicknesses t1 and t2 are dimensions in the stacking direction X or lateral direction Y at portions to which the cooling tubes 30 are projected in the stacking direction X or lateral direction Y.

As shown in FIGS. 4 and 10, at least a part of each of the front wall section 52 and the rear wall section 53 forms an H-shaped wall section 55 having a roughly H-shaped cross section. The H-shaped wall section 55 is constituted of a pair of longitudinal plate sections 551 perpendicular to the stacking direction X, and a connecting section 552 connecting these longitudinal plate sections 551 together.

As shown in FIGS. 2 and 3, at least a part of each of the side wall sections 54 forms an L-shaped wall section having a roughly L-shaped cross section. As shown in FIG. 5, the L-shaped wall section is constituted of a main wall portion 541 having a major surface facing the inner surface of the frame 5, and an inward portion 542 projecting toward the inner side of the frame 5 from one end of the main wall portion 541 in the direction perpendicular to the stacking direction X. In this embodiment, the L-shaped wall section is formed by the whole of the side wall section 54. As shown in FIGS. 2 and 7, the inward portion 542 of the side wall section 54 projects more inward in the vicinity of the support pin 14 than the other portion.

Figure 9:
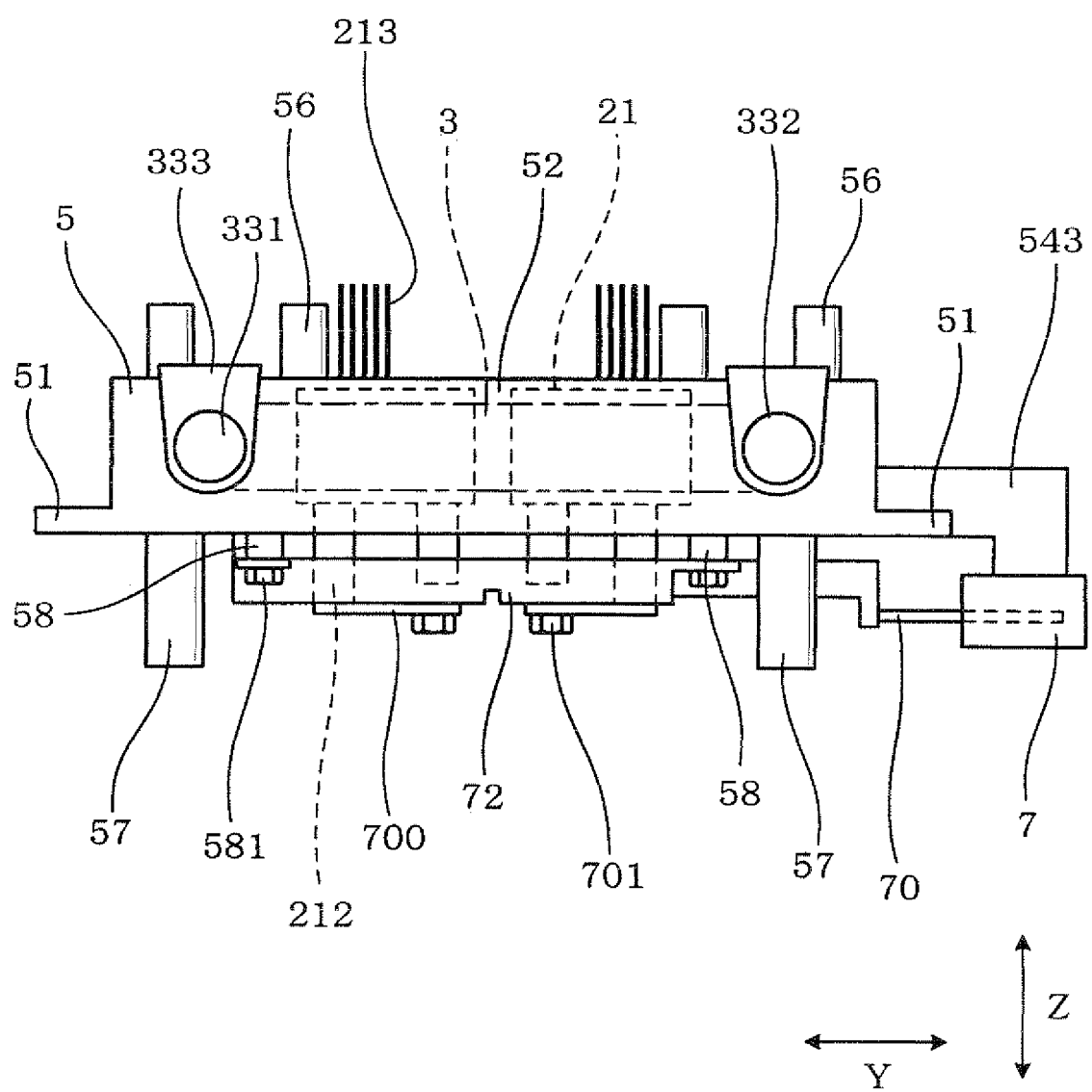
FIG. 9 is a view of the frame as viewed from the direction of the arrow C of FIG. 8.

The frame 5 is open at both sides in the height direction Z. As shown in FIGS. 9 and 10, the main electrode terminals 212 and the control terminals 213 of each semiconductor module 21 respectively project to one side (top side) of the height direction Z and the other side (bottom side) of the height direction Z. In the present application, the description is made assuming that the bottom side of the height direction Z corresponds to the direction of projection of the main electrode terminals 212, and the top side of the height direction Z corresponds to the direction of projection of the control terminals 213. However, this assumption is just for explanation. Likewise, the words "front", "rear", "lateral" are also just for explanation.

Figure 12:
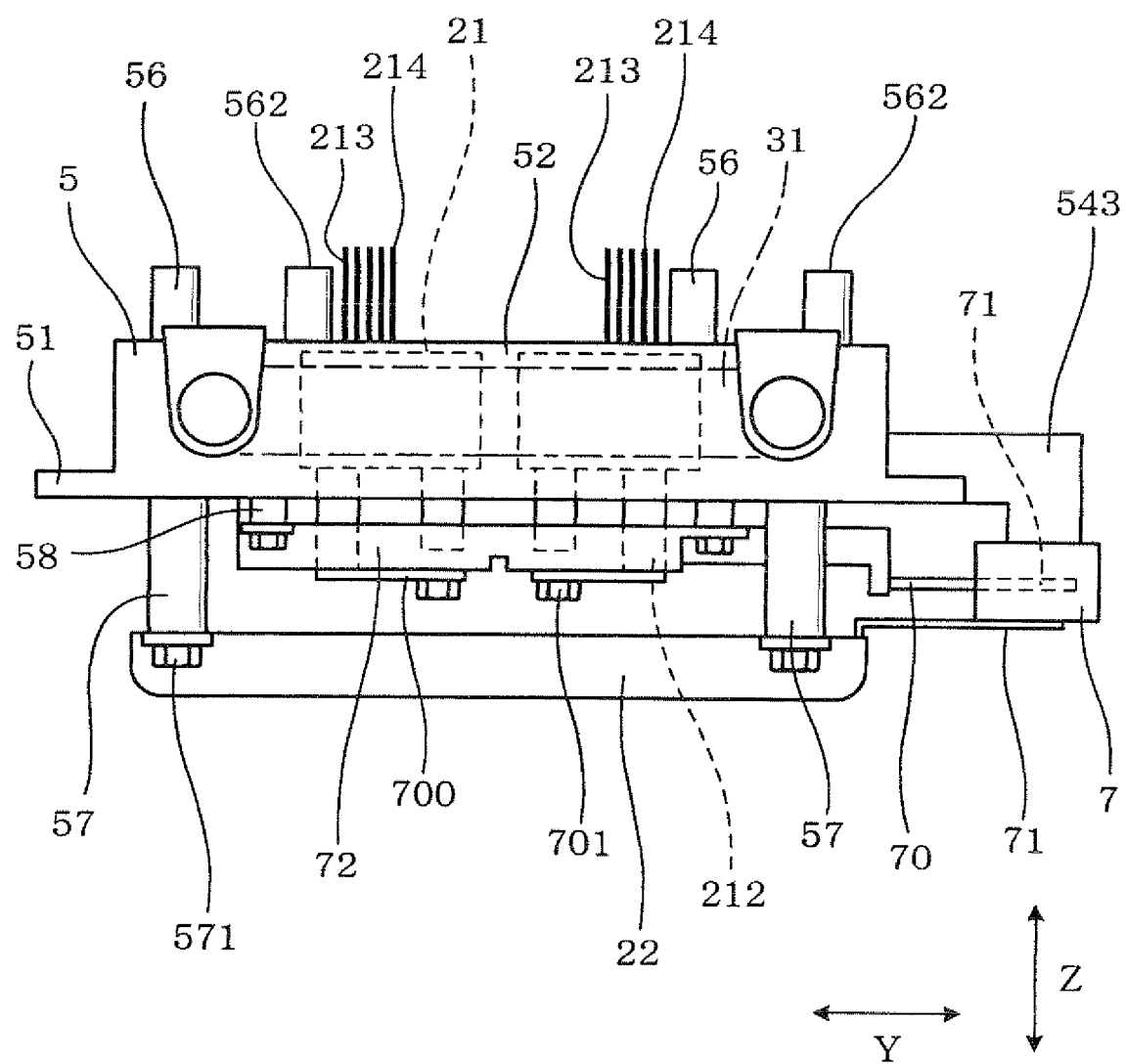
FIG. 12 is a view of the frame as viewed from the direction of the arrow E of FIG. 11.
Figure 13:
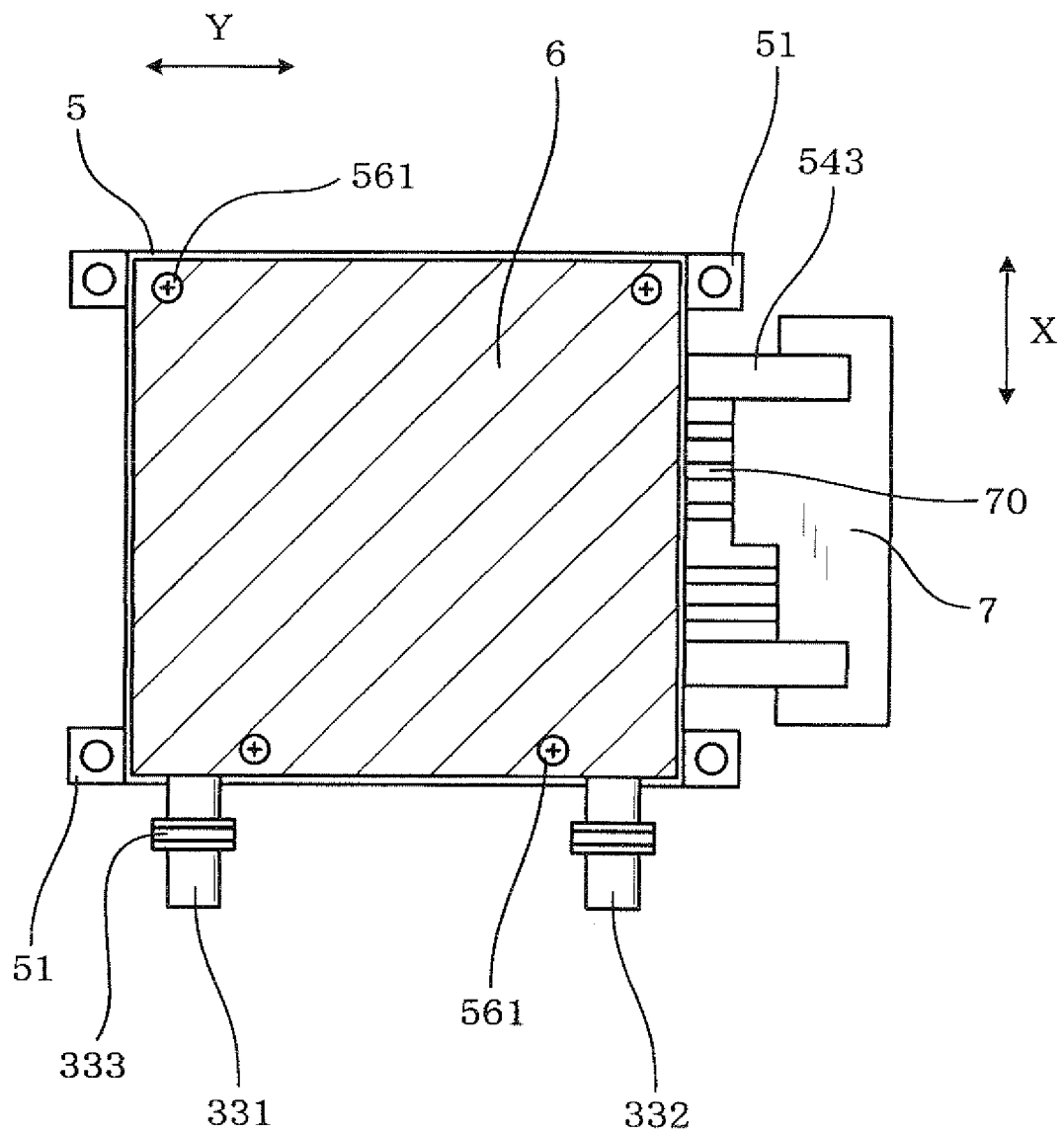
FIG. 13 is a plan view of the frame of the first embodiment, on which a control circuit board is further assembled, that is, a plan view of an internal unit of the first embodiment.
Figure 14:
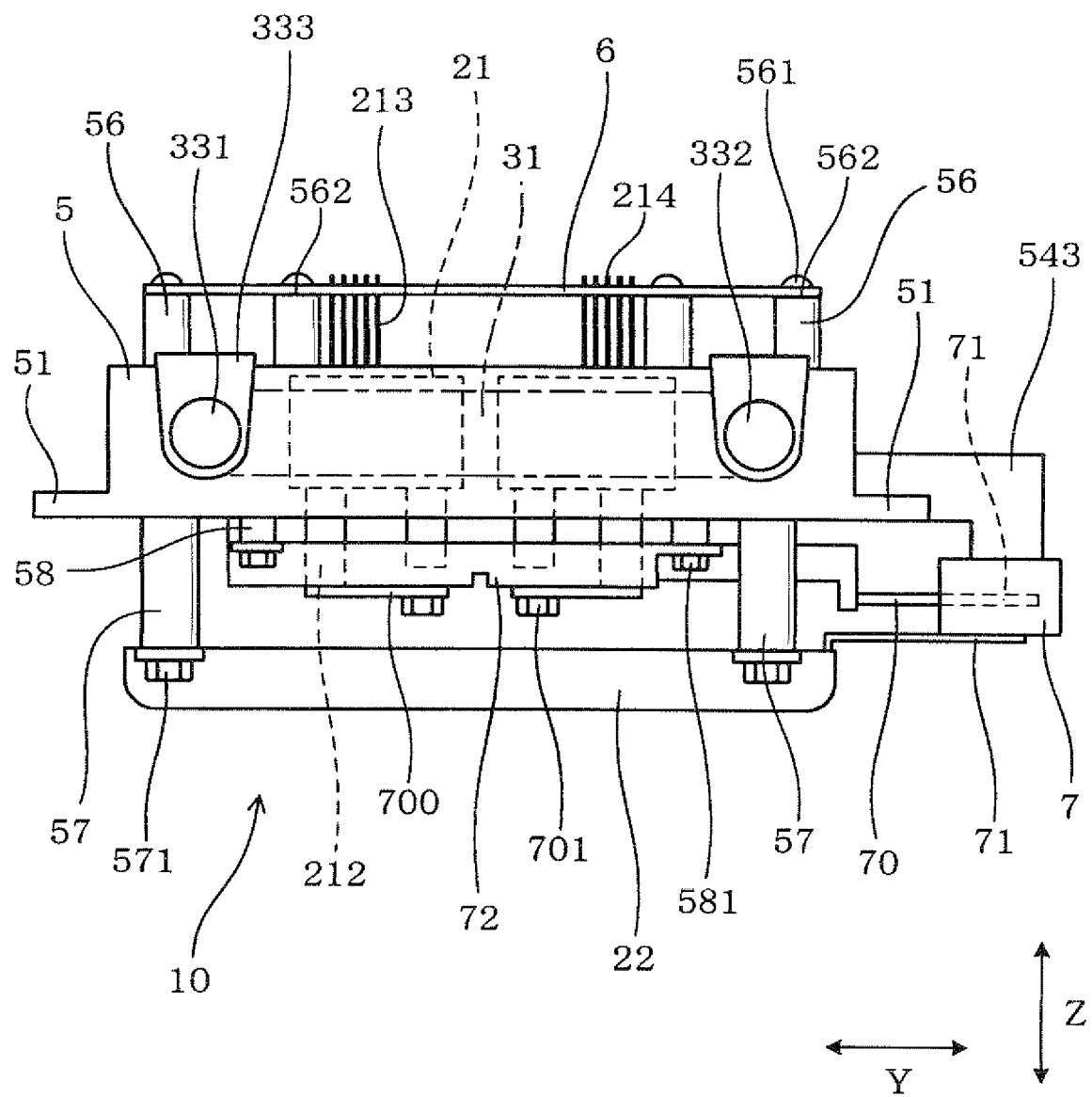
FIG. 14 is a front view of the internal unit of the first embodiment.
Figure 15:
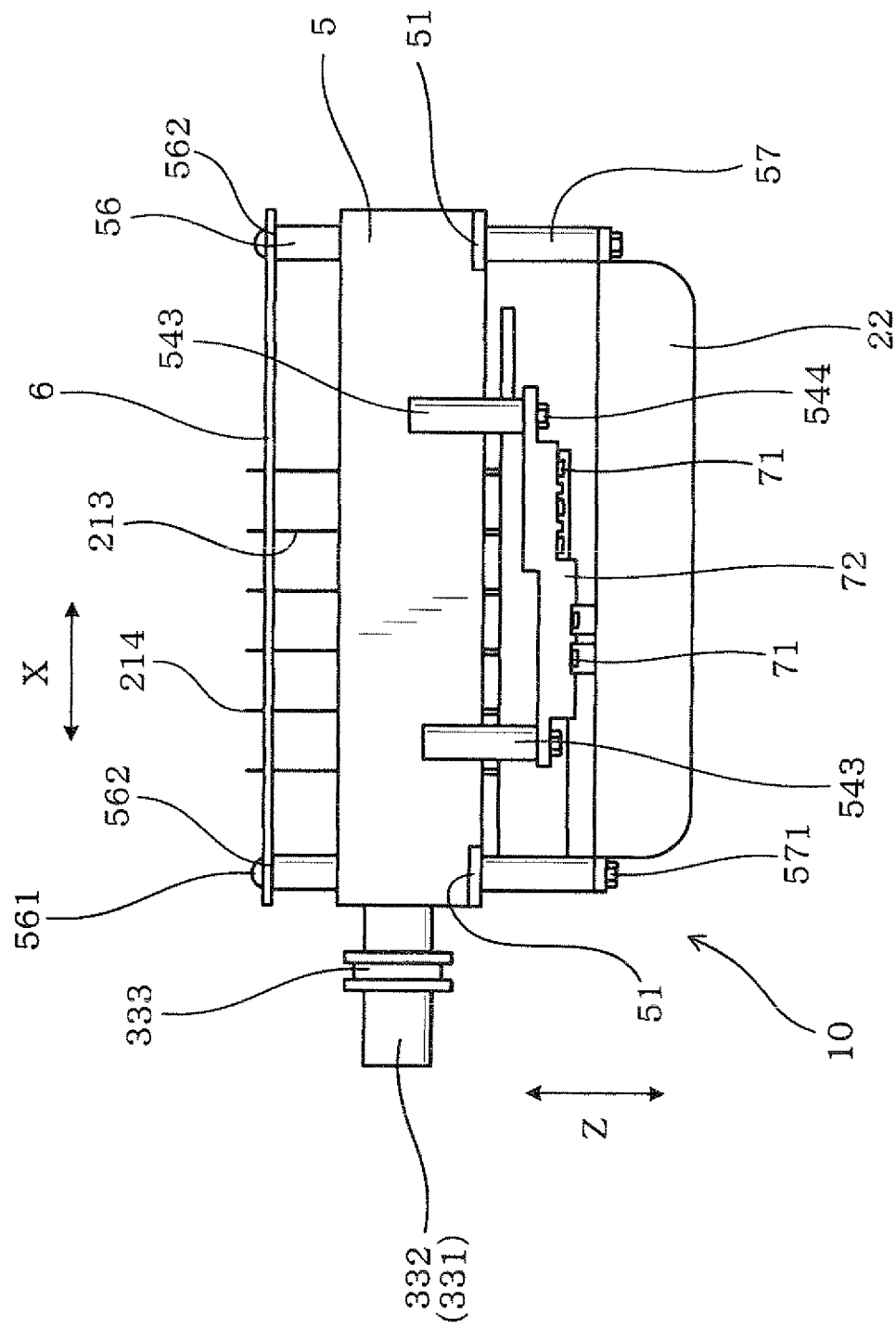
FIG. 15 is a side view of the internal unit of the first embodiment.

As shown in FIGS. 1 and 13 to 19, the internal unit 10 includes a control circuit board 6 on which a control circuit for controlling the switching elements included in the semiconductor modules 21 is formed. The control terminals 213 of the semiconductor module 21 are connected to the control circuit board 6. As shown in FIGS. 13 and 14, the unit fixing sections 51 of the frame 5 are located more outward than the outer edge of the control circuit board 6. As shown in FIGS. 2, 14 and 15, the frame 5 is provided with four board fixing sections 56 for fixing the control circuit board 6 to the internal unit 10, which are located more inward than the unit fixing sections 51. The board fixing sections 56 are constituted of two bosses formed in each of the front wall section 52 and the rear wall section 53 so as to project upward in the height direction Z. As shown in FIGS. 13 to 15, each of the board fixing sections 56 is formed with a threaded hole in which a screw 561 is inserted to secure the control circuit board 56 to the frame 5 in four positions. As shown in FIGS. 12, 14 and 15, each of the board fixing sections 56 is formed so as to project in the projecting direction of the control terminals 213 of the semiconductor modules 21, and have, on a position closer to the frame 5 than the tips 214 of the control terminals 213, a board abutment surface 562 for abutment with the control circuit board 6.

Figure 11:
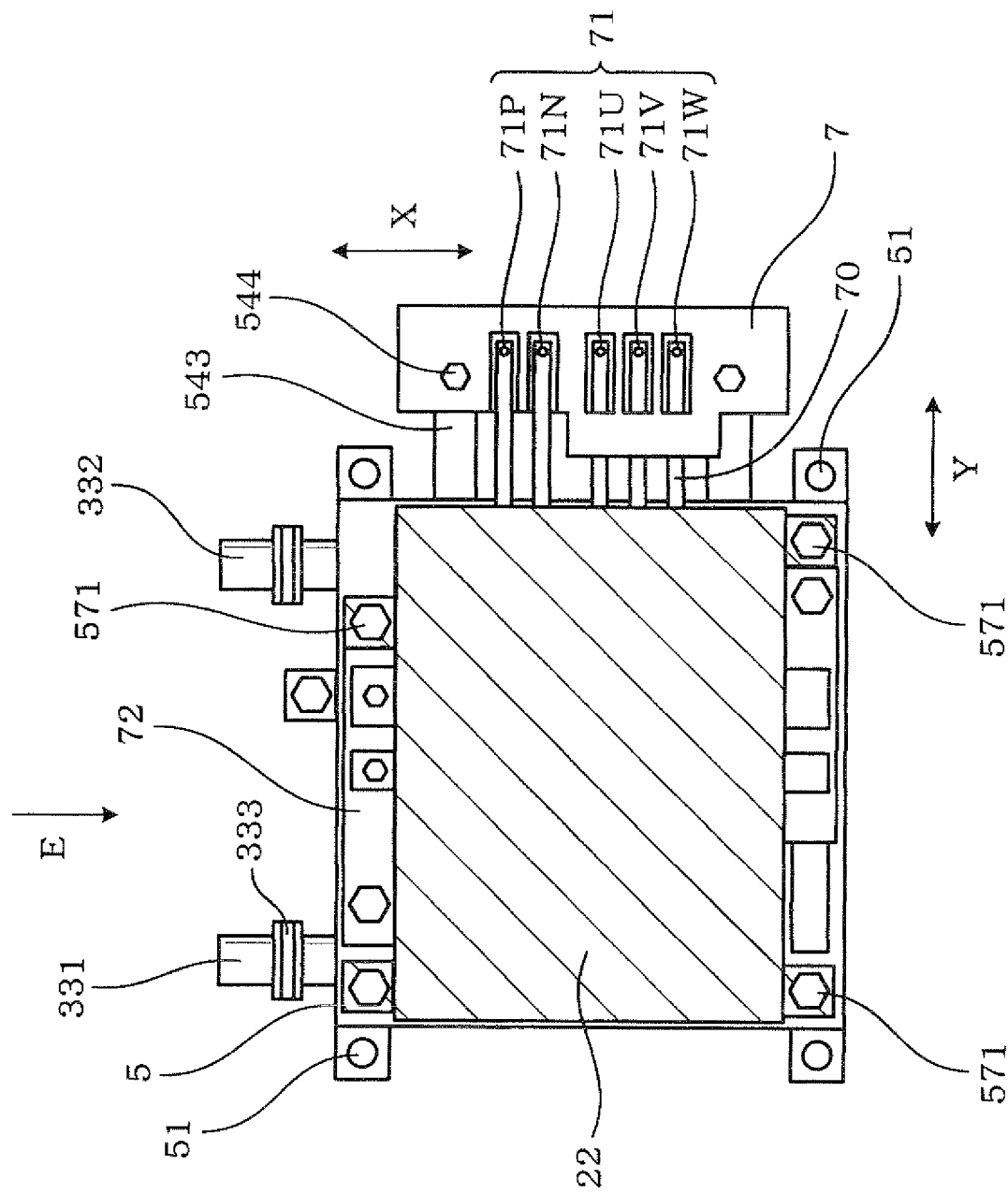
FIG. 11 is a plan view of the frame of the first embodiment, on which a capacitor is further assembled.

As shown in FIGS. 14 and 15, the internal unit 10 includes a capacitor 22. The frame 5 includes four capacitor fixing sections 57 for fixing the capacitor 22 to the internal unit 10. As shown in FIGS. 3, 11 and 14, the capacitor fixing sections 57 are located more inward than the unit fixing sections 51. The capacitor fixing sections 57 are constituted of two bosses formed in each of the front wall section 52 and the rear wall section 53 so as to project to the opposite side of the board fixing sections 56, that is, downward in the height direction Z. Each of the capacitor fixing sections 57 is formed with a threaded hole in which a bolt 571 is inserted to secure the capacitor 22 to the frame 5 in four positions.

As shown in FIGS. 11 to 15, the internal unit 10 includes a terminal block 7 on which input/output terminals 71 for input and output of controlled electric power are mounted for making connection between the input/output terminals 71 and external devices such as a DC battery and a three-phase electric rotating machine. The terminal block 7 is fixed to two support arms 543 by bolts 544, the support arms 543 being formed in one of the side wall sections 54 so as to project outward.

The input/output terminals 71 include a pair of capacitor terminals 71P and 71N electrically connected to a pair of electrodes of the capacitor 22, and three output terminals 71U, 71V and 71W electrically connected to the main electrode terminals 212 of the semiconductor modules 21 and to be respectively connected to the U-phase, V-phase and W-phase of the three-phase electric rotating machine. The input/output terminals 71 are respectively formed at one ends of bus bars which are connected to the capacitor 22 or semiconductor modules 21 at the other ends thereof.

Of these bus bars, the ones 70 respectively formed with the output terminals 71U, 71V and 71W are partially molded with resin to form an integrated bus bar assembly 72. As shown in FIGS. 3, 14 and 15, the frame 5 includes bus bar fixing sections 58 for fixing the bus bar assembly 72. In this embodiment, the bus bar fixing sections 58 are formed in three positions. Two of the three bus bar fixing sections 58 are located at positions closer to the terminal block 7 than to the center of the frame 5.

The internal unit 10 includes all the electronic components constituting the power conversion circuit. That is, all the electronic components of the power conversion apparatus 1 belong to the internal unit 10, and none of the electronic components is directly fixed to the case 4. As shown in FIG. 1, the case 4 is constituted of a case body 40 which is open upward, and a lid body 400 closing the opening of the case body 40. The unit support sections 41 are formed integrally with the case body 40.

The case body 40 is provided with a flange section 42 around the outer periphery of the opening. Also, the lid body 400 is provided with a flange section 420 around the outer periphery thereof. The case body 40 and the lid body 400 are joined together with a seal member (not shown) interposed between their flange sections 42 and 420 by bolts 431 and nuts 432. Accordingly, the internal unit 10 is sealingly enclosed in the case 4.

Figure 19:
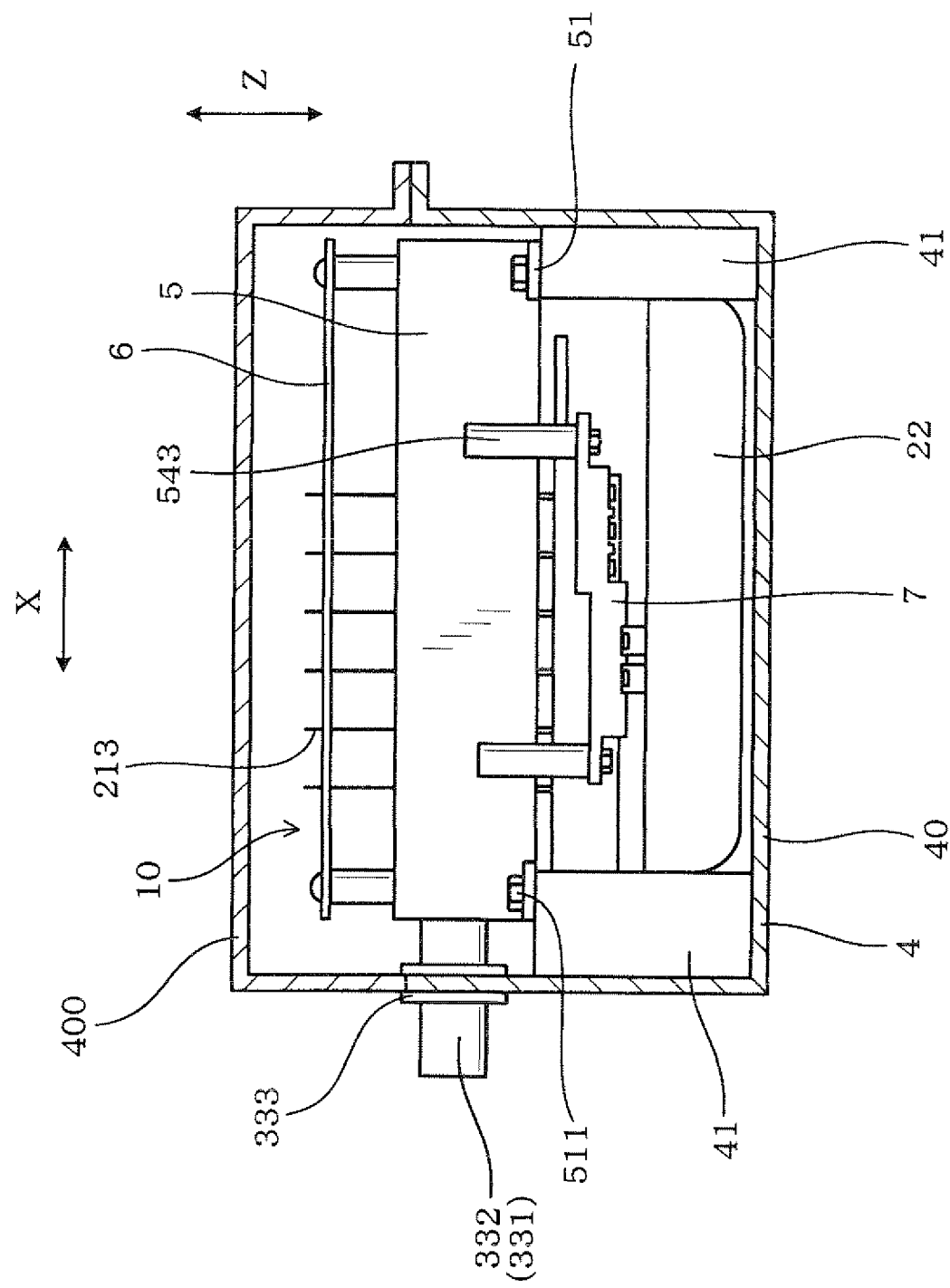
FIG. 19 is a cross-sectional view of the power conversion apparatus according to the first embodiment as viewed along the line G-G of FIG. 16.

As shown in FIGS. 16 and 19, each of the coolant introduction tube 331 and the coolant discharge tube 332 is connected to the stacked body 11 (see FIG. 7) so as to partially protrude from the case 4. Each of the coolant introduction tube 331 and the coolant discharge tube 332 is provided with an annular packing 333 at its outer periphery. The case body 40 is formed with two recesses (not shown) through which the coolant introduction tube 331 and the coolant discharge tube 332 passes, respectively. Each of the annular packings 333 is held between the case body 40 and the lid body 400 in the state of being fitted to the coolant introduction tube 331 or coolant discharge tube 332 at one of the recesses. Accordingly, the case 4 can be hermetically sealed allowing the coolant introduction tube 331 and the coolant discharge tube 332 to protrude outward from the case 4.

The case 4 is further formed with through holes as passages of electric wires and spaces for installing connectors for connection of the electronic components and the control circuit board 6 with external devices. These through holes are provided with seal members to ensure water tightness of the case 4.

To assemble the power conversion apparatus 1 having the above-described structure, the internal unit 10 is assembled first as shown in FIGS. 13 to 15. Next, the internal unit 10 is accommodated and fixed in the case body 40 as shown in FIGS. 16 to 18. Finally, the internal unit 10 is sealingly enclosed in the case 4 by joining the lid body 400 to the case body 40 as shown in FIGS. 1 and 19.

To assemble the internal unit 10, the frame 5 shown in FIGS. 2 to 6 is prepared. Next, the stacked body 11 of the semiconductor modules 21 and the cooling tubes 31 stacked alternately is disposed inside the frame 5 as shown in FIGS. 7 and 10. Incidentally, the cooling tubes 31 are coupled together through the joint tubes 32, and the cooler 33 including the coolant introduction tube 331 and the coolant discharge tube 332 connected thereto is assembled before the above step. When the stacked body 11 is disposed inside the frame 5, the coolant introduction tube 331 and the coolant discharge tube 332 are respectively placed on concave portions 522 formed in the frame (see FIGS. 2 and 6). The coolant introduction tube 331 and the coolant discharge tube 332 are clamped from upward toward the frame 5 by clamp members 16 fixed to the front wall sections 52.

The pressure member 12 is disposed between the rear end of the stacked body 11 and the rear wall section 53. Subsequently, the pressure member 12 is pushed forward at around both ends thereof by a pressure jig while being elastically deformed in the stacking direction X in order to compress the stacked body 11. When the pressure member 12 is deformed by a predetermined amount, the column-shaped support pins 14 are inserted between the rear wall section 53 of the frame 5 and each end of the pressure member 12. Thereafter, the pressure jig is pulled away from the pressure member 12 while being moved backward in order to bring the pair of the support pins 14 to the state of being held between the pressure member 12 and the rear wall section 53. This state is also a state in which the stacked body 11 is compressed in the stacking direction by a predetermined pressure due to an urging force applied from the pressure member 12.

Figure 8:
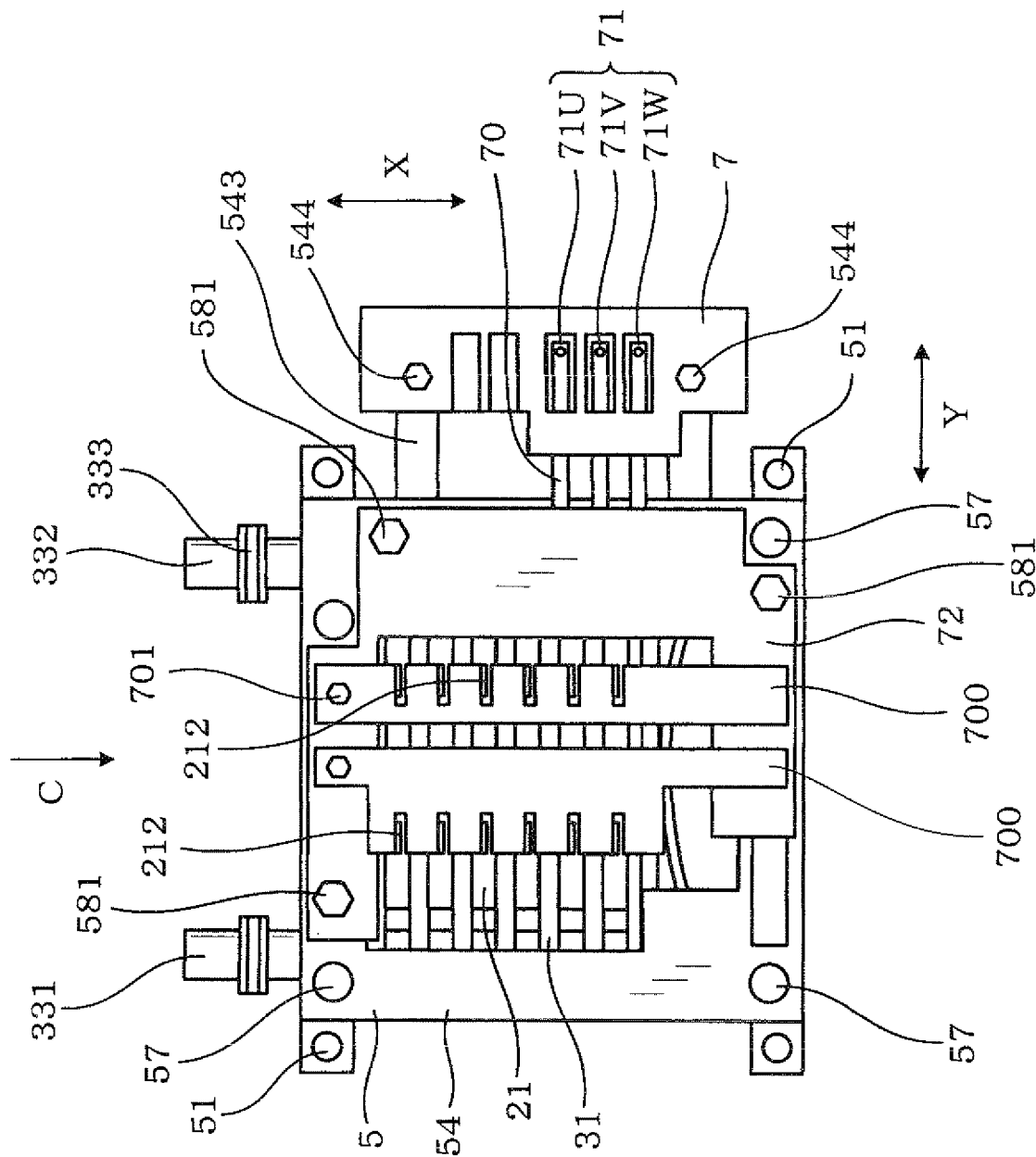
FIG. 8 is a plan view of the frame of the first embodiment, on which a bus bar assembly is further assembled.

Next, the terminal block 7 is fixed to the support arms 543 of the frame 5 by the bolts 544 as shown in FIGS. 7 to 9. Next, the resin-molded bus bar assembly 72 is fixed to the frame 5, and the bus bars 70 are welded to the main electrode terminals 212 of the semiconductor modules 21. Further, the input/output terminals 71U, 71V and 71W formed in the bus bars 70 are placed on the terminal block 7. The bus bar assembly 72 is fixed to bus bar fixing sections 58 formed at three positions in the frame 5 by bolts 581.

Thereafter, bus bars 700 for connection between the semiconductor modules 21 and the capacitor 22 are welded to the main electrode terminals 212 of the semiconductor modules 21, and fixed to the bus bar assembly 72 by bolts 701.

Next, as shown in FIGS. 11 and 12, the capacitor 22 is fixed to the lower side of the frame 5. More precisely, the capacitor 22 is secured to the capacitor fixing sections 57 provided in the frame 5 by the bolts 571, and the pair of the capacitor terminals 71P and 71N are disposed on the terminal block 7.

Next, as shown in FIGS. 13 to 15, the control circuit board 6 is disposed above the frame 5, and the control terminals 213 of the semiconductor modules 21 are inserted and connected into the through holes formed in the control circuit board 6. Subsequently, the circuit board 6 is fixed to the board fixing sections 56 of the frame 5 by the screws 561. This completes assembly of the internal unit 10.

Thereafter, as shown in FIGS. 16 to 18, the internal unit 10 is fixed to the case body 40. More precisely, the unit fixing sections 51 of the frame 5 which serves as an outer shell of the internal unit 10 are placed on the upper surfaces of the unit support sections 41 formed in the case body 40. At this time, the annular packings attached to the coolant introduction tube 331 and the coolant discharge tube 332 are respectively fitted into the concave portions 44 formed in the case body 40. In this state, the bolts 511 are inserted into the thorough holes famed in the unit fixing sections 51, and screwed into the threaded holes formed in the unit support sections 41 in order to fix the internal unit 10 to the case body 40.

Subsequently, as shown in FIGS. 1 and 19, the lid body 400 is placed on the opening of the case body 40 with the seal member being interposed therebetween, and the lid body 400 and the case body 40 are joined together at their flange sections 42 and 420 by the bolts 431 and the nuts 432. As a result, the internal unit 10 is sealingly enclosed in the case 4. This completes assembly of the power conversion apparatus 1.

In the following, the effects and advantages of this embodiment are explained. The power conversion apparatus 1 has the structure in which the electronic components (the semiconductor modules 21, capacitor 22 and so on) and the cooler 3 are fixed to the frame 5, so that the electronic components, the cooler 3 and the frame 5 are integrated as the internal unit 10. The internal unit 10 is fixed within the case 4. Accordingly, since the internal unit 10 serves as a beam of the case 4, the rigidity of the case 4 can be improved. That is, since the case 4 can have a sufficient rigidity without being increased in the wall thickness, or being provided with reinforcing ribs, it is possible to reduce the material cost and the manufacturing cost of the case 4, and also to reduce the weight of the case 4.

Fixing the internal unit 10 to the case 4 makes it possible to suppress external force applied to the respective electronic components and the cooler 3 included in the internal unit 10 through the case 4. This makes it possible to suppress the electronic components and the cooler 3 included in the internal unit 10 from being affected by external vibration and thermal stress.

The electronic components and other members are not directly fixed to the case 4, but assembled in the internal unit 10 to be fixed to the case 4. Accordingly, assembling work of the power conversion apparatus 1 becomes easy. Also, maintenance of the power conversion apparatus 1 becomes easy, because the whole internal unit 10 can be removed from the case 4 for maintenance work.

Since assembly and maintenance of the power conversion apparatus 1 can be carried out outside the case 4, the case 4 does not have to be provided with two or more lids. Accordingly, the sealing surface between the case body 40 and the lid body 400 can be one in number. This makes it possible to improve the water tightness of the case 4, and to reduce the sealing material of the case 4, to thereby reduce the material cost and man-hour cost for application of the sealing material to the case 4. The internal unit 10 is sealingly enclosed in the case 4. That is, since the whole internal unit 10 including the frame 5 is sealingly enclosed in the case 4, the sealing surface can be one in number.

Since the internal unit 10 is fixed to the frame 5 within the case 4, and serves as a beam of the case 4 as described above, the rigidity of the case 4 can be further improved. Since the frame 5 is made of a conductive material, and is shaped to surround the semiconductor modules from all four sides, it can shield electromagnetic noise emitted from the semiconductor modules 21. The case 4 is also made of a conductive material, and accordingly electromagnetic noise emitted from the semiconductor modules 21 can be shielded doubly by the frame 5 and the case 4.

As shown in FIGS. 7 and 10, the stacked body 11 in which the cooling tubes 31 and the semiconductor modules 21 are stacked alternately is included in the internal unit 10. Since this makes it possible to assemble the stacked body 11 outside the case 4, the power conversion apparatus 1 can be assembled more easily.

Since the stacked body 11 is constituted of the cooling tubes 31 and the semiconductor modules 21 stacked alternately, the semiconductor modules 21 can be cooled efficiently, and the stacked body 11 can be made compact in size.

The internal unit 10 includes the pressure member 12. The pressure member 12 is interposed between the rear wall section 53 of the frame 5 and the rear end of the stacked body 11 whose front end is supported by the front wall section 52 of the frame 5. Accordingly, the reaction force of the pressure member 12 can be supported by the frame 5. Accordingly, the case 4 is not required to have rigidity large enough to bear the reaction force of the pressure member 12, or to include ribs. This makes it possible to make the case 4 light in weight and less expensive.

The frame 5 includes the four unit fixing sections 51, two of them being disposed on one side of the stacking direction X, the other two of them being disposed on the other side of the stacking direction X. These four unit fixing sections 51 are located more outward in the stacking direction X than the pair of the support portions of the frame 5 (the inner surface 521 of the front wall section 52 and the inner surface 531 of the rear wall section 531) applied with the reaction force toward outside in the stacking direction X from the stacked body 11 and the pressure member 12. Accordingly, the frame 5 can resist the reaction force of the stacked body 11 and the pressure member 12 with the aid of the case 4. This is because the case 4 reinforces the fame 5, to thereby prevent the frame 5 from being deformed.

The fame 5 includes the front wall section 52, the rear wall section 53 and the pair of the side wall sections 54.
Accordingly, the stacked body 11 can be held stably within the frame 5. The wall thickness of the front and rear wall sections 52 and 53 is larger than that of the side wall sections 54. That is, as shown in FIGS. 4 and 5, the wall thickness t1 is larger than the wall thickness t2. Accordingly, it is possible to improve the rigidities of the front and rear wall sections 52 and 53 receiving the reaction force of the pressure member 12, while reducing the weight of the side wall sections 54 not directly receiving the reaction force of the pressure member 12. This makes it possible to make the frame 5 light in weight, while ensuring the frame 5 to have rigidity large enough to resist the reaction force of the pressure member 12.

As shown in FIG. 4, part of each of the front and rear wall sections 52 and 53 is constituted as the roughly H-shaped wall section 55. Accordingly, the frame 5 can be made light in weight, while ensuring the high rigidity of the front and rear wall sections 52 and 53. As shown in FIG. 5, since each of the side wall sections 54 is constituted as the roughly L-shaped wall section, it is possible to reduce the weight of the side wall sections 54 and the material cost, while ensuring them to have sufficient rigidity.

As shown in FIG. 10, the semiconductor modules 21 stacked together with cooling tubes 31 have the structure in which the main electrode terminals 212 and the control terminals 213 project toward the opposite sides in the height direction Z, and the frame 5 is open to both sides in the height direction Z. Accordingly, as shown in FIGS. 8 and 13 to 15, the bus bars 70 and 700 and the control circuit board 6 can be easily assembled to the semiconductor modules 21.

The internal unit 10 includes also the control circuit board 6. Accordingly, since it is not necessary to assemble the control circuit board 6 directly to the case 4, the assembling work of the control circuit board 6 can be facilitated, and external force applied to the control circuit boar 6 can be reduced.

As shown in FIG. 2, the unit fixing sections 51 provided in the frame 5 are located outward of the outer edge of the control circuit board 6. Accordingly, the internal unit 10 can be easily assembled to the case 4. This is because if the unit fixing sections 51 are located inward of the outer edge of the control circuit board 6, the internal unit 10 assembled with the control circuit board 6 cannot be easily fixed to the case 4.

In this case, to fix the internal unit 10 to the case 4, it is necessary to drill holes penetrating the wall of the case 4 through which bolts or the like are inserted in, for example. However, in this case, not only the workability is lowered, but also more sealing members have to be used to ensure the water tightness of the case 4. By locating the unit fixing sections 51 outward of the outer edge of the control circuit board 6, such a problem can be removed.

The frame 5 includes the board fixing sections 56. Accordingly, since the control circuit board 6 can be assembled as a part of the internal control unit 10, the assembling work of the power conversion apparatus 1 can be further facilitated. In addition, vibration and force transmitted from the outside to the control circuit board 6 can be suppressed. The board fixing sections 56 are formed projecting in the projecting direction of the control terminals 213 of the semiconductor modules 21. This facilitates the connection between the control terminals 213 of the semiconductor modules 21 and the control circuit board 6. Each of the board fixing sections 56 includes, at a position closer to the frame 5 than the tips of the control terminals 213, the board abutment surface 562 for abutment with the control circuit board 6. This facilitates making a reliable connection between the control terminals 213 of the semiconductor modules 21 and the control circuit board 6 fixed to the board fixing sections 56.

The board fixing sections 56 of the frame 5 are located more inward than the unit fixing sections 51. This facilitates connecting the control circuit board 6 to the frame 5, and connecting the internal unit 10 to the case 4.

The internal unit 10 includes also the capacitor 22. Accordingly, it is possible to reduce external force applied to the capacitor 22. Further, it is possible to suppress vibration of the capacitor 22 being transmitted to the outside through the case 4. This makes it possible to suppress unpleasant vibration sound from occurring in the vehicle cabin due to vibration of the capacitor 22.

As shown in FIG. 3, the capacitor fixing sections 57 provided in the frame 5 are located more inward than the unit fixing sections 51. Accordingly, the capacitor 22 can be easily fixed to the frame 5, and the internal unit 10 can be easily assembled to the case 4.

The internal unit 10 includes also the terminal block 7. Accordingly, since the terminal block 7 can be assembled to the internal unit 10 outside the case 4, the assembling work of the terminal block 7 can be facilitated.

The frame 5 includes the plurality of the bus bar fixing sections 58 for fixing the bus bars 70 and the bus bar assembly 72. Accordingly, the bus bars 70 and the bus bar assembly 72 can be stably fixed to the frame 5. As shown in FIGS. 3 and 8, two of the bus bar fixing sections 58 are located at the position closer to the terminal block 7 than to the center of the frame 5. Accordingly, the bus bar assembly 72 can be stably fixed to the frame 5, and the input/output terminals 71 can be stably disposed on the terminal block 7. As a result, a stable connection between the input/output terminals 71 and external terminals can be ensured.

The internal unit 10 includes all the electronic components constituting the power conversion circuit. Accordingly, all the electronic components constituting the power conversion circuit can be protected from an external force, and the power conversion apparatus easy to manufacture and excellent in maintainability can be provided.

As described above, according to the first embodiment, there is provided a less expensive power conversion apparatus which is capable of reducing an external force applied to its electronic components while improving the rigidity of its case, and is excellent in water tightness and maintainability.

Second Embodiment

Next, a second embodiment of the invention is described with reference to FIGS. 20 to 26. In the second embodiment, a wire holding section 59 for holding a conductive wire 15 is additionally provided in the frame 5 of the power conversion apparatus 1. At least one end of the conductive wire 15 is disposed within the case 4. In this embodiment, the conductive wire 15 connects the capacitor 22 with the control circuit board 6 within the case 4, so that the voltage across the capacitor 22 can be sent to the control circuit board 6 through the conductive wire 15 as a voltage signal indicative of the input voltage of the power conversion apparatus 1. The conductive wire 15 is covered with resin except at both ends thereof, and has flexibility. The conductive wire 15 is laid outside the frame 5 to make a connection between the control circuit board 6 and the capacitor 22.

Figure 20:
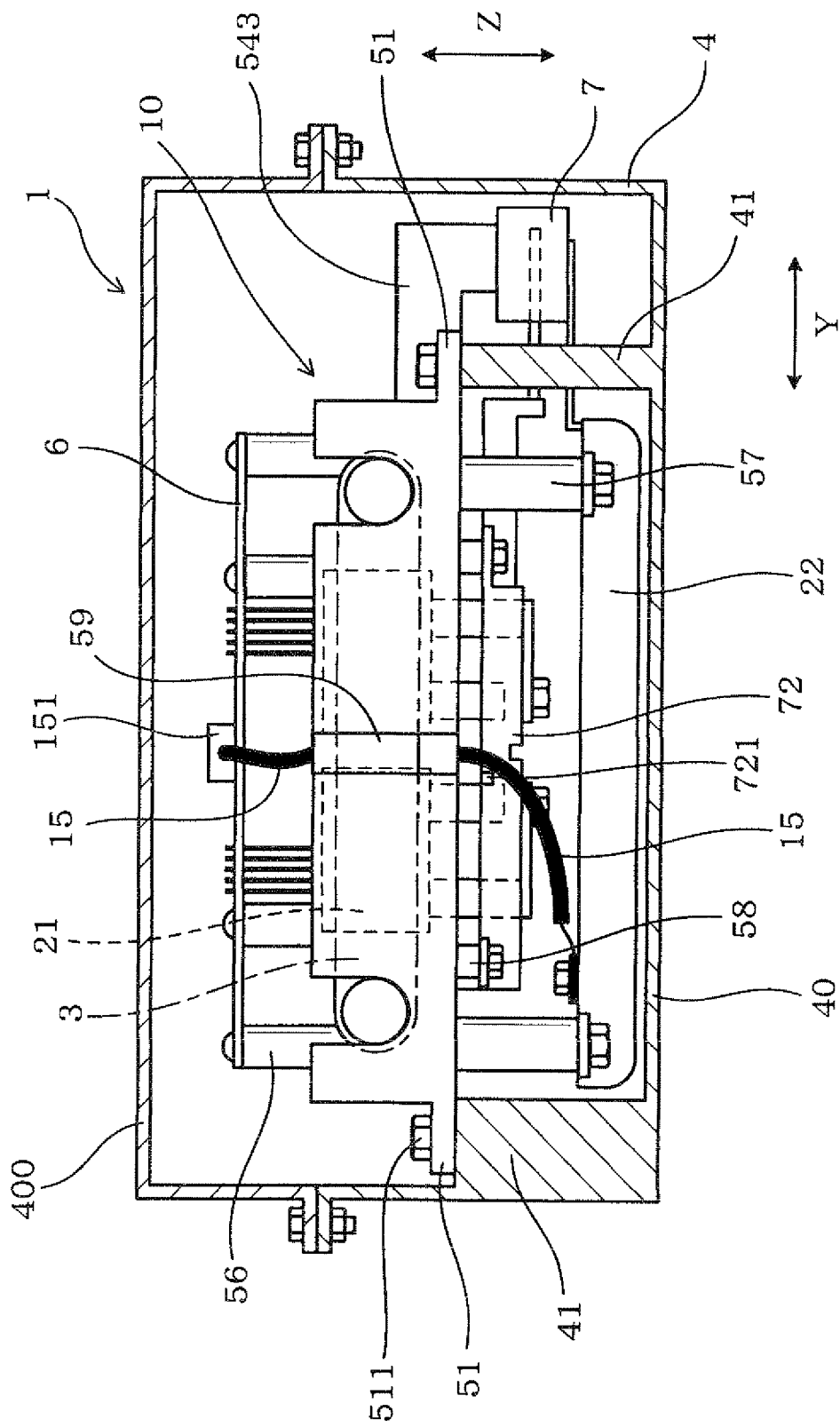
FIG. 20 is a cross-sectional view of a power conversion apparatus according to a second embodiment of the invention.
Figure 21:
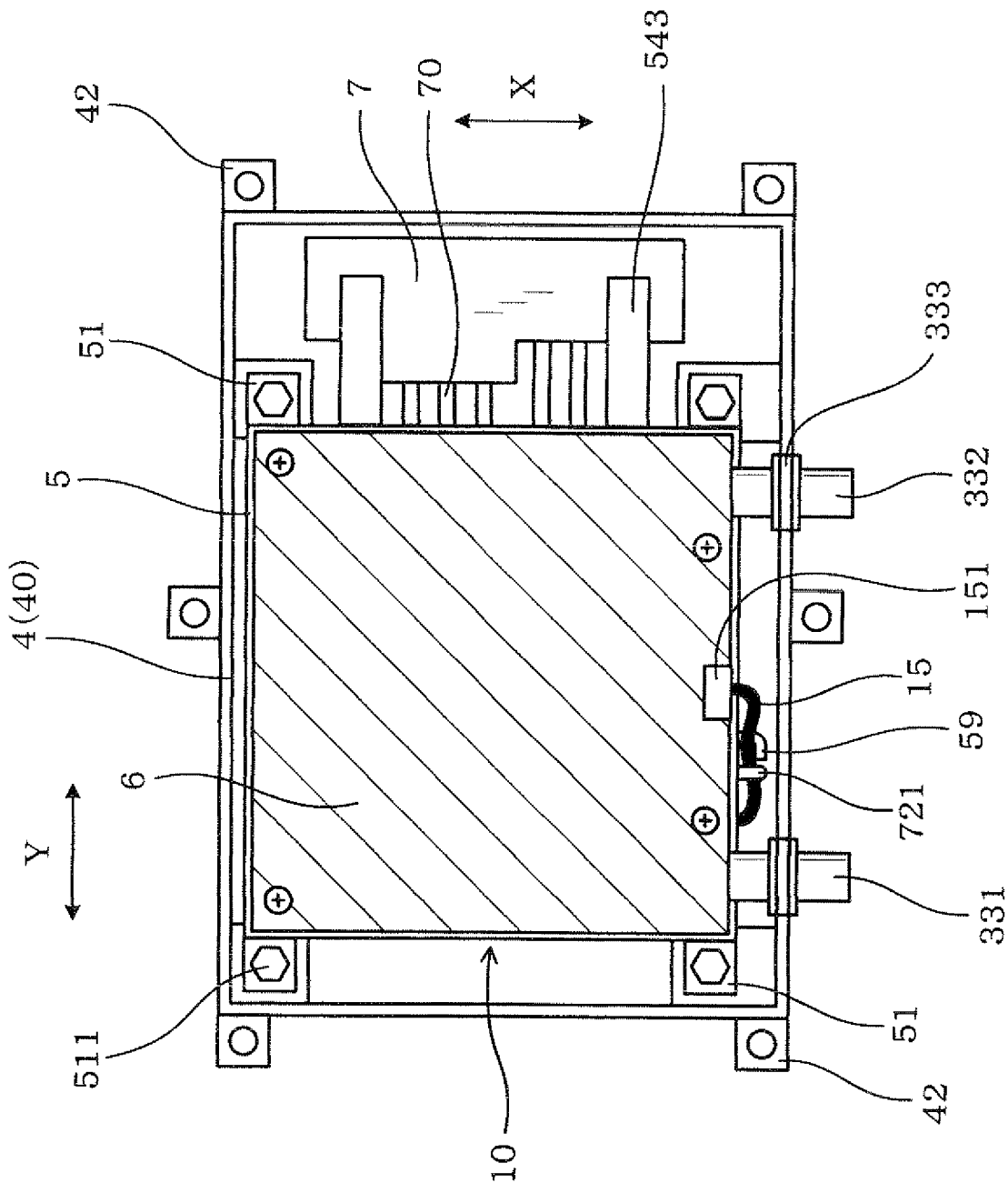
FIG. 21 is a plan view of the power conversion apparatus according to the second embodiment before a lid body is assembled.
Figure 22:
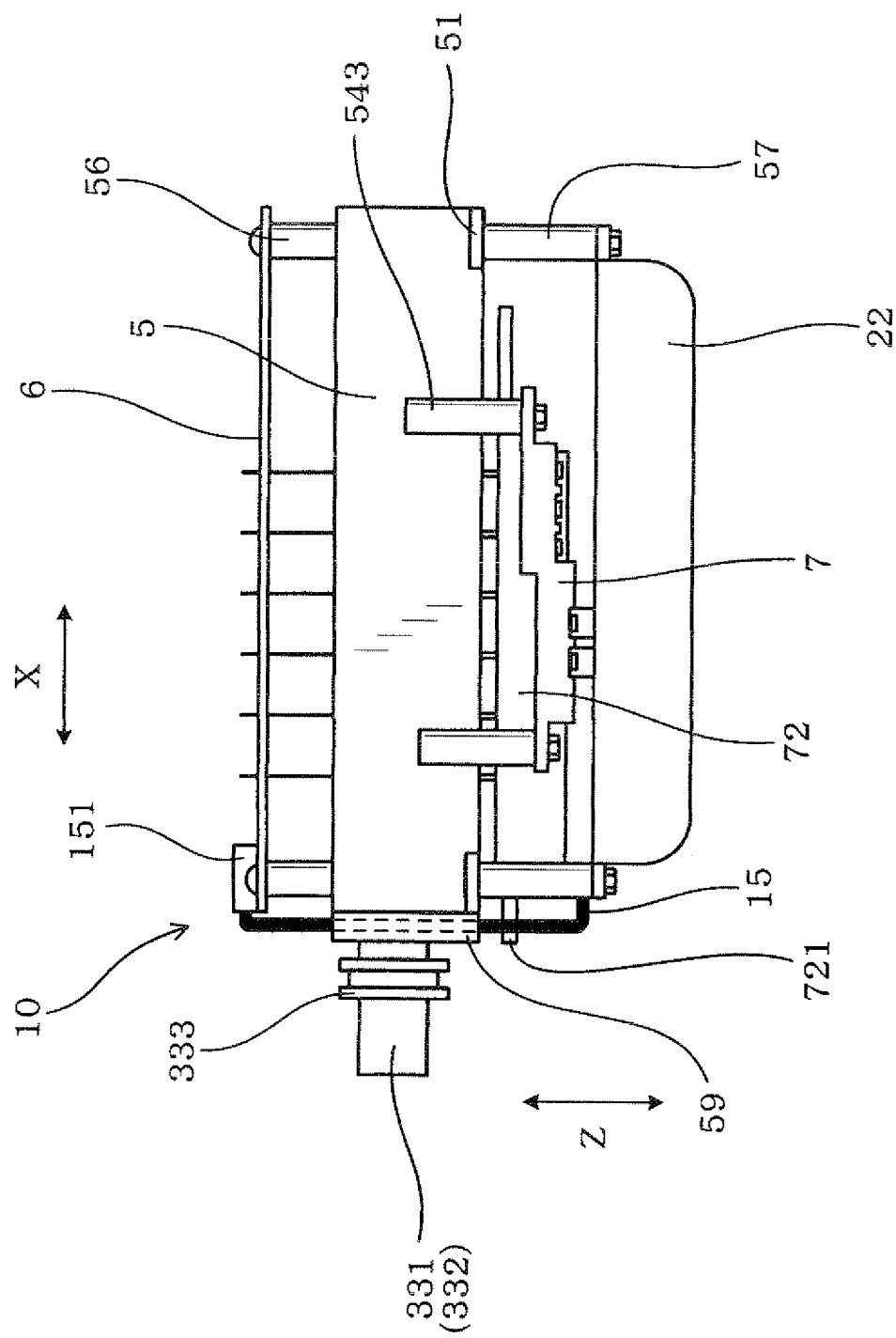
FIG. 22 is a side view of an internal unit of the power conversion apparatus according to the second embodiment.
Figure 23:
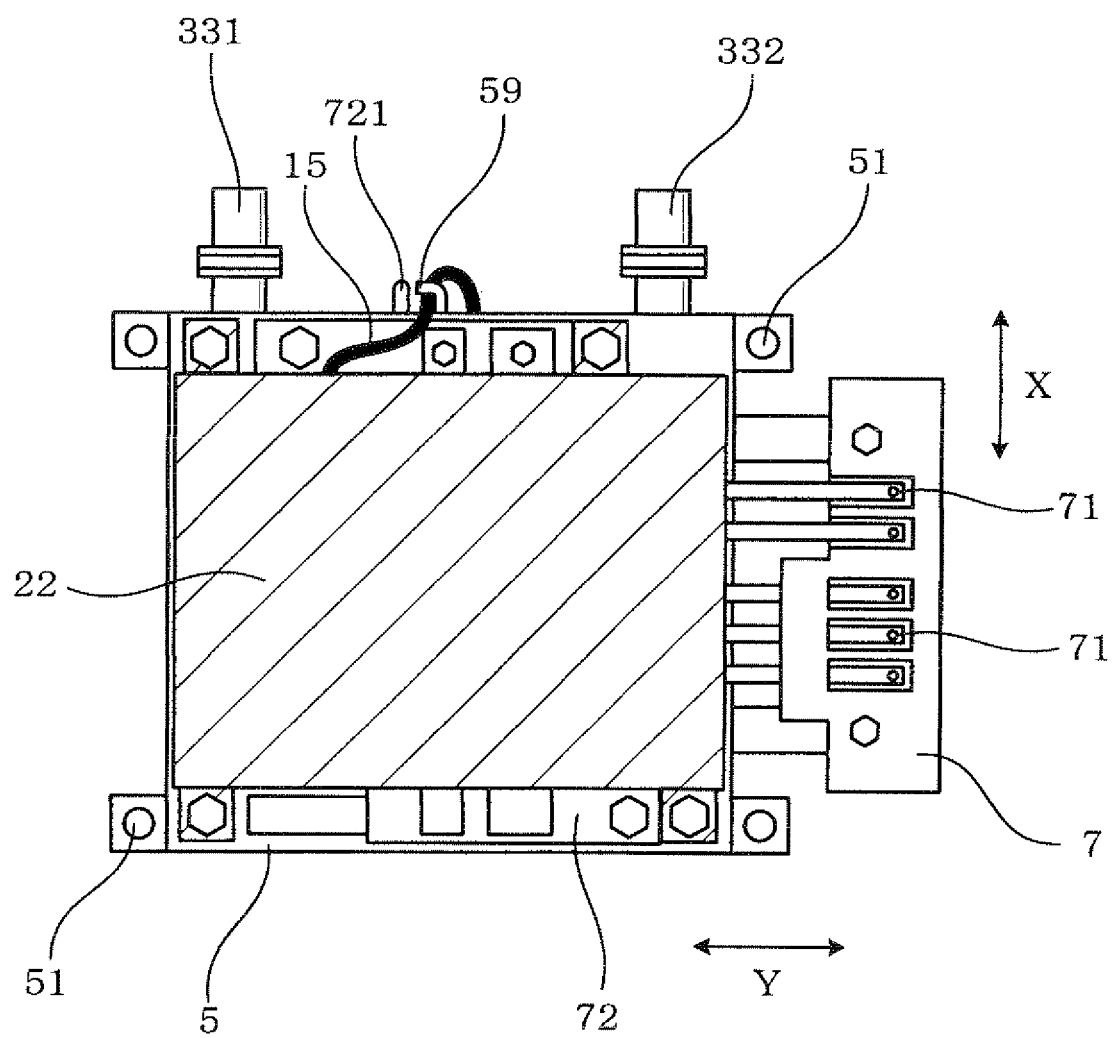
FIG. 23 is a bottom view of the internal unit of the second embodiment.
Figure 24:
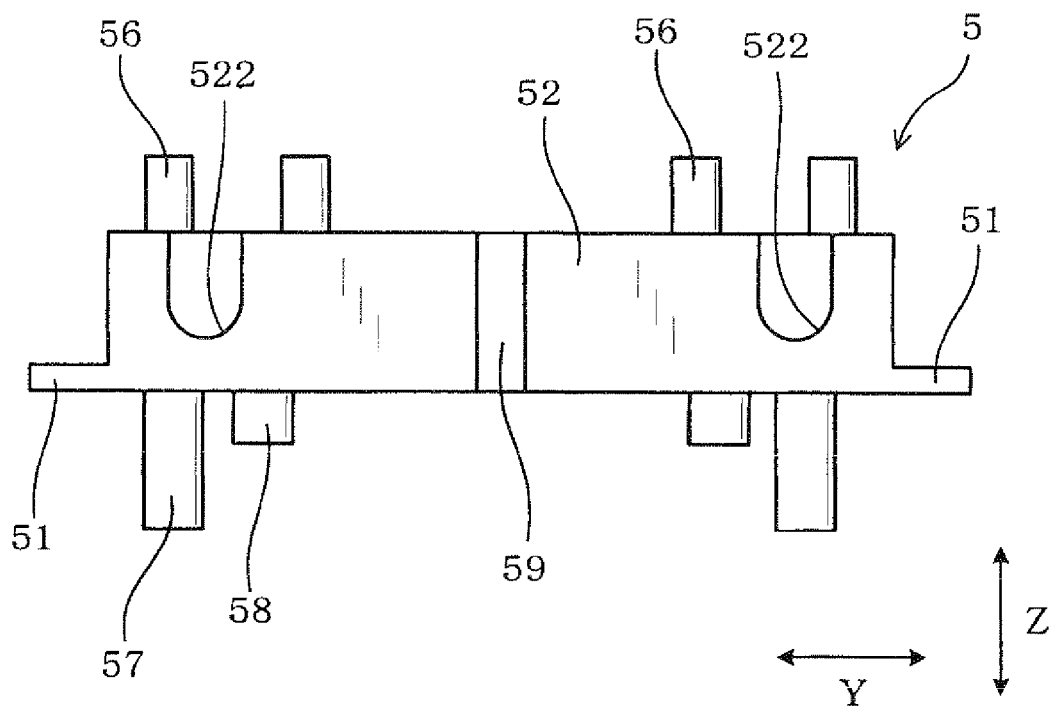
FIG. 24 is a front view of a frame of the power conversion apparatus according to the second embodiment.
Figure 25:
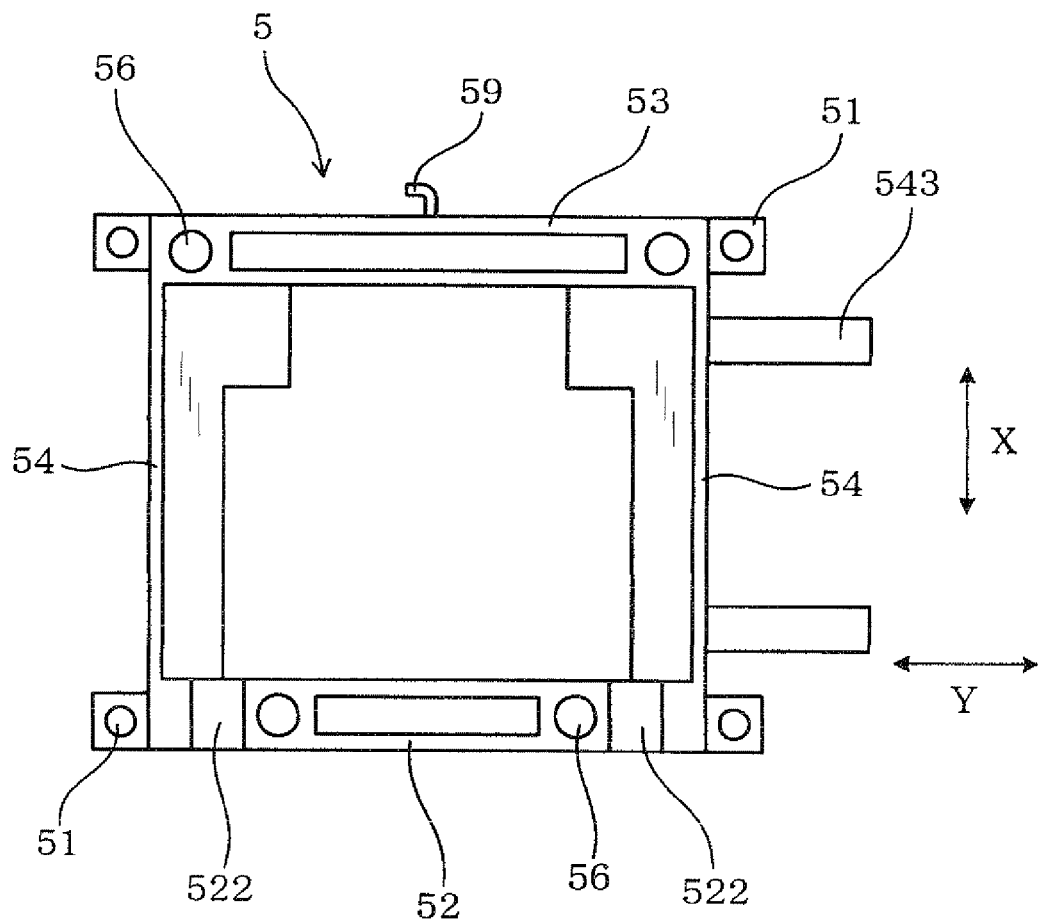
FIG. 25 is a plan view of the frame of the second embodiment.
Figure 26:
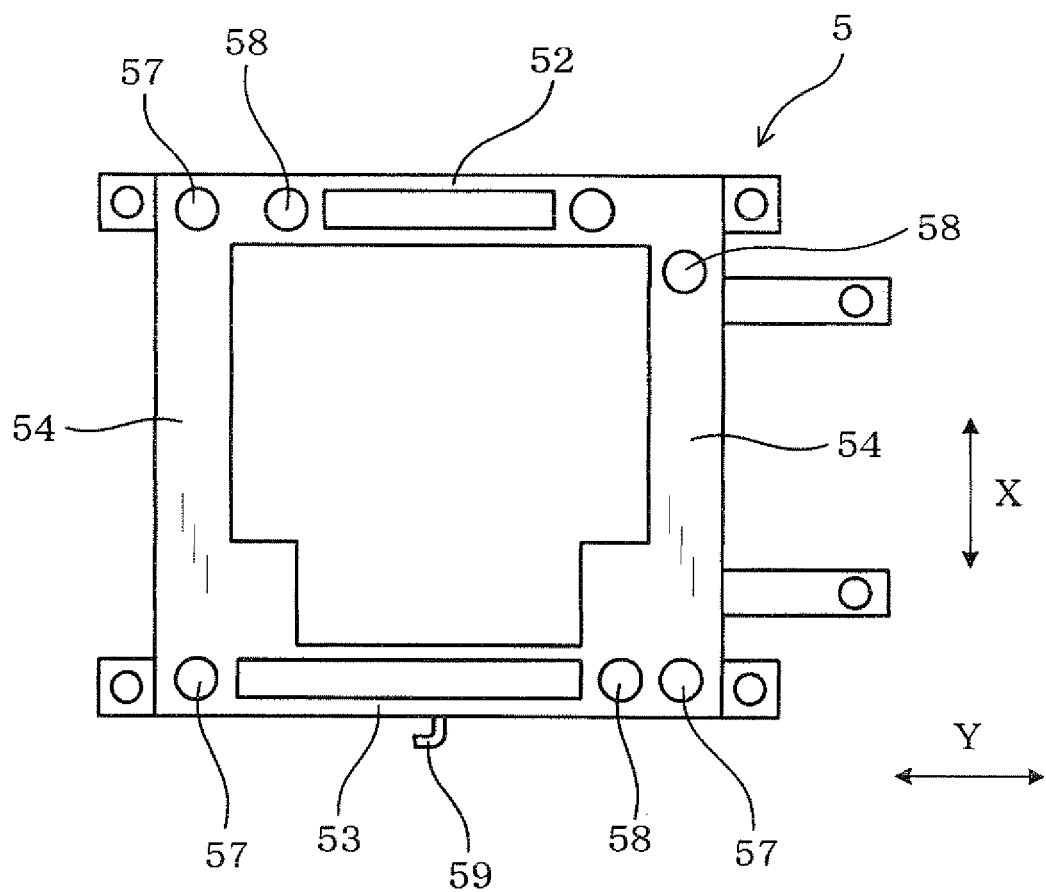
FIG. 26 is a bottom view of the frame of the second embodiment.

The wire holding section 59 has a hook-like shape when viewed from the height direction Z as shown in FIGS. 21, 23, 25 and 26, and extends in the height direction Z as shown in FIGS. 20, 22 and 24. The wire holding section 59 is formed in the front wall section 52 of the frame 5 so as to project outward therefrom. As shown in FIGS. 21 and 23, a part of the conductive wire 15 is fitted in the space between the wire holding section 59 and the front wall section 52.

As shown in FIGS. 20 to 23, the bus bar assembly 72 is formed with a forward projecting section 721 projecting forward in the stacking direction X. The forward projecting section 721 is located in a position opposite to the open side of the wire holding section 59 when viewed from the height direction Z. The forward projecting section 721 serves to prevent the conductive wire 15 from coming off the wire holding section 59. The wire holding section 59 is located at nearly the same position in the lateral direction Y as a connector section 151 of the conductive wire 15 for connection with the control circuit board 6. The components of this embodiment are the same as those of the first embodiment except for the above.

In the second embodiment, the conductive wire 15 can be laid along the frame 5. Accordingly, the internal unit 10 can be prevented from being caught by the conductive wire 15 when it is put in or taken out of the case 4. Other than the above, the second embodiment provides the same advantages as those provided by the first embodiment.

It is possible that the wire holding section 59 holds a wire different form the conductive wire 15 provided for making a connection between the capacitor 22 and the control circuit board 6. The wire holding section 59 may be formed in a shape and a position different from those described above, so that the conductive wire 15 can be laid along the lateral direction Y. The wire holding section 59 may be formed in two or more positions in the frame 5.

Third Embodiment

Figure 27:
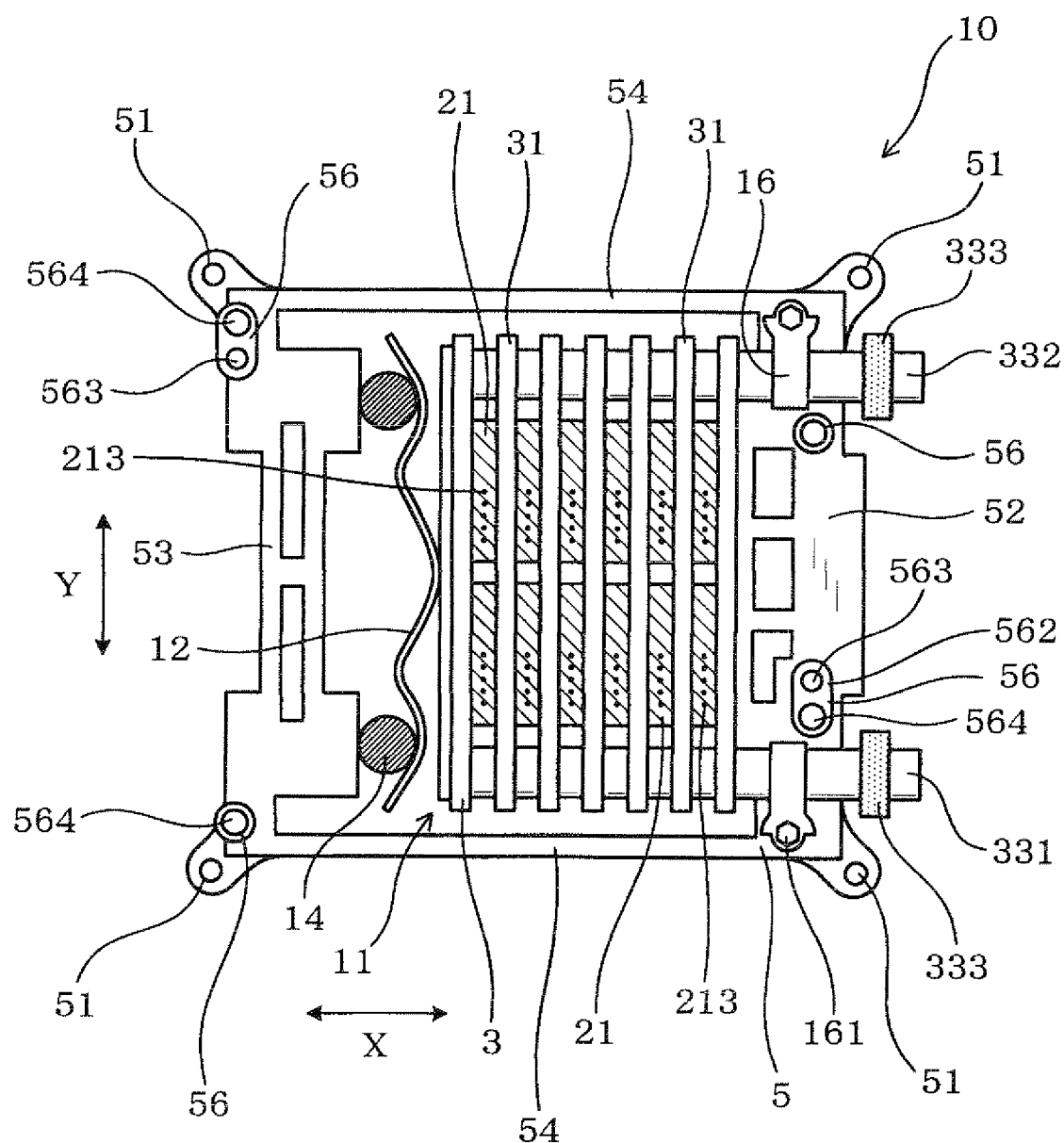
FIG. 27 is a plan view of an internal unit of a power conversion apparatus according to a third embodiment of the invention, before a control circuit board is assembled thereto.
Figure 28:
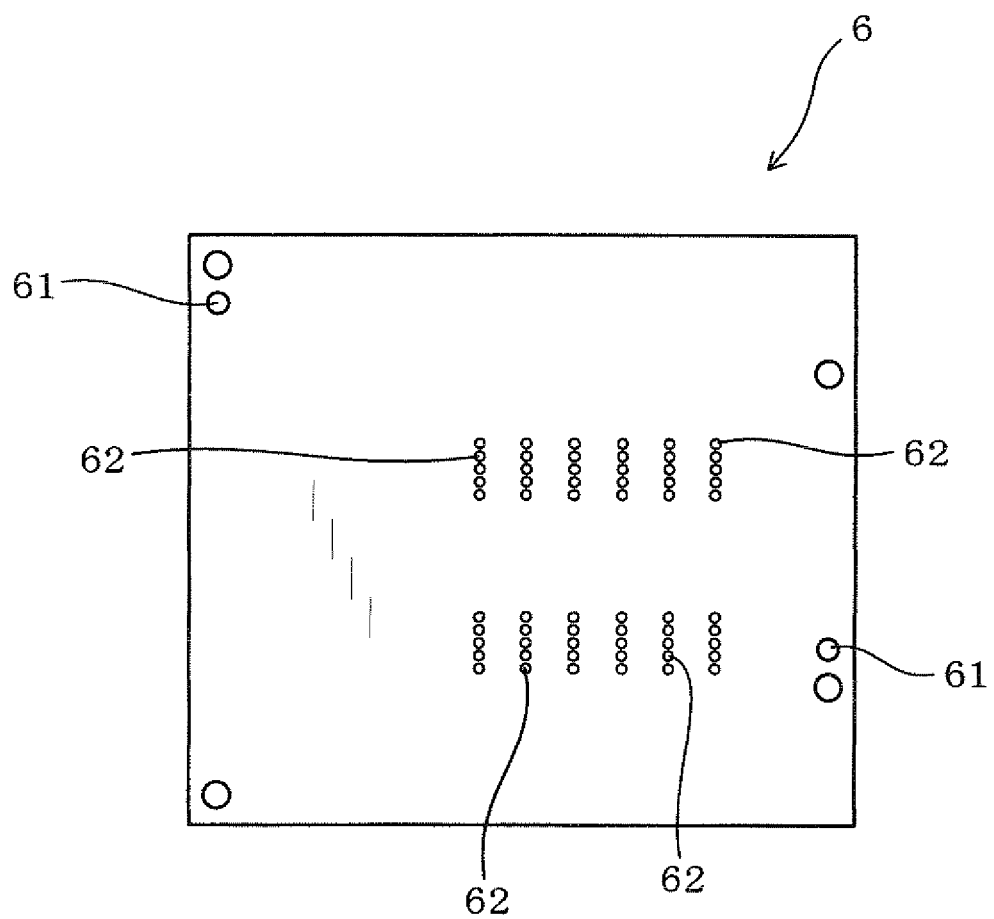
FIG. 28 is a plan view of the control circuit board of the third embodiment.
Figure 29:
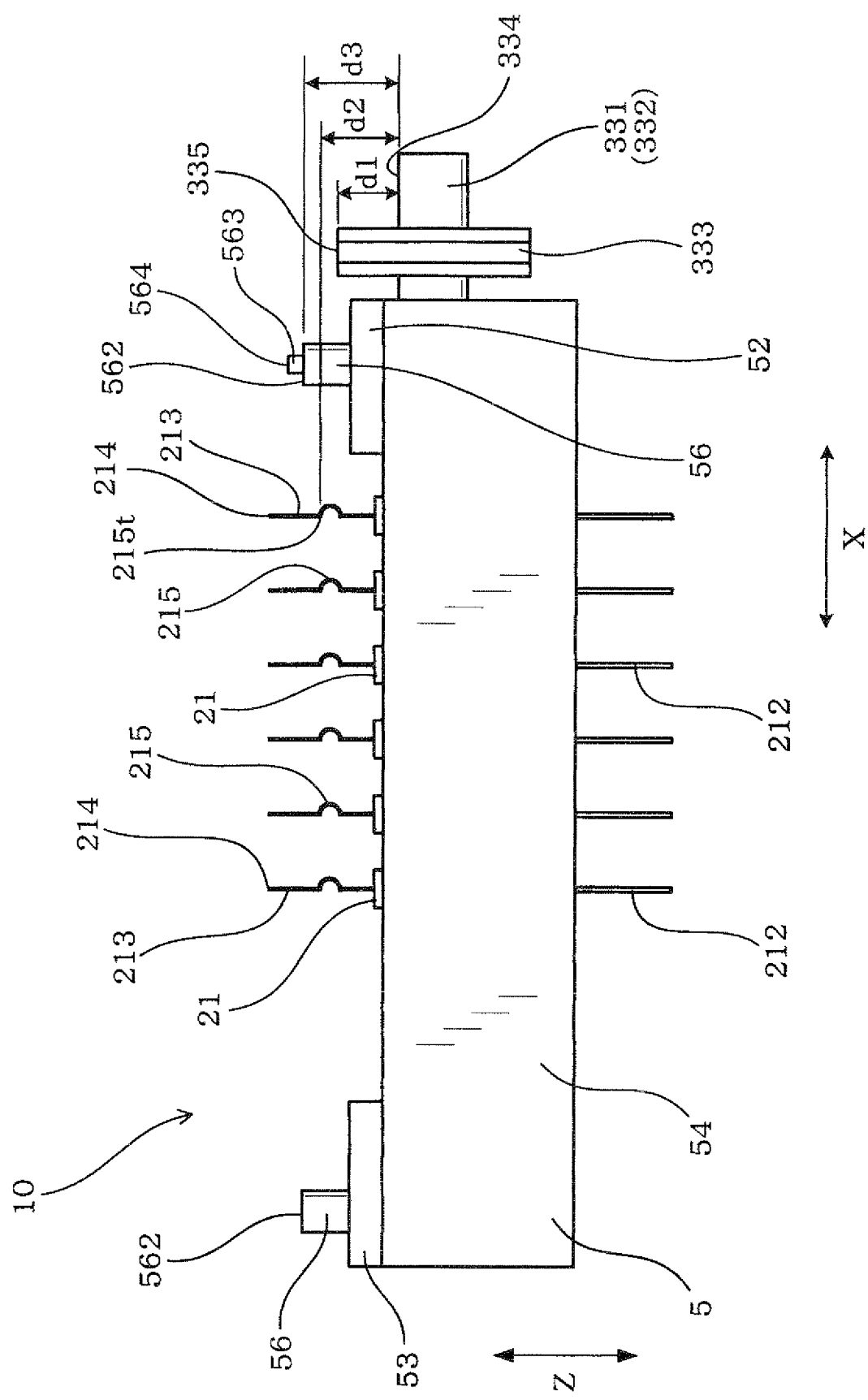
FIG. 29 is a side view of the internal unit of the third embodiment, before the control circuit board is assembled thereto.

Next, a third embodiment of the invention is described with reference to FIGS. 27 to 34. In the third embodiment, some of the board fixing sections 56 of the frame 5 are formed with a positioning pin 563 for positioning the control circuit board 6. In this embodiment, as shown in FIGS. 27 to 29, each of the positioning pins 563 projects from the board abutment surface 562 of the board fixing section 56, and is inserted into a positioning hole 61 formed in the control circuit board 6 (see FIG. 28). As shown in FIG. 29, each of the tips 564 of the positioning pins 563 is located in a position closer to the frame 5 in the height direction Z than the tips of the control terminals 213 of the semiconductor modules 21.

As shown in FIG. 27, two of the four board fixing sections 56 of the frame 5 are respectively formed with the positioning pin 563. Each of the four board fixing sections 56 has a boss shape, and is formed with a threaded hole 564 at its front end surface, that is, at its board abutment surface 562. The board abutment surfaces of the two of the four board fixing sections 56 have an oval shape from which the column-shaped positioning pin 563 adjoining the threaded hole 564 projects.

Two of the board fixing sections 56 are formed in the front wall section 52, and another two of the board fixing sections 56 are formed in the rear wall section 53. The two board fixing sections 56 formed in the front wall section 52 are located between the coolant introduction tube 331 and the coolant discharge tube 332. One of the two board fixing sections 56 formed in the front wall section 52 and one of the two board fixing sections 56 formed in the rear wall section 53 are respectively provided with the positioning pin 563.

In the third embodiment, as in the case of the first embodiment, the stacked body 11 of the semiconductor modules 21 and the cooling tubes 31 stacked alternately is disposed within the frame 5 as a part of the internal unit 10. As shown in FIG. 29, each of the control terminals 213 of the semiconductor modules 21 includes a bent portion 215. When the distance in the height direction Z from the upper end 334 of the coolant introduction tube 331 or the coolant discharge tube 332 as a reference position to the upper end 335 of the annular packing 33 is d1, the distance to the upper ends 215t of the bent portions 215 of the control terminals 213 is d2, and the distance to the board abutment surfaces 562 of the board fixing sections 56 is d3, the relationship of d3>d2>d1 holds. That is, the board abutment surfaces 562 of the board fixing sections 56 are above the upper ends 215t of the bent portions 215 in the height direction Z, and the upper ends of the annular packings 333 are below the upper ends 215t of the bent portions 215 in the height direction Z.

Figure 34:
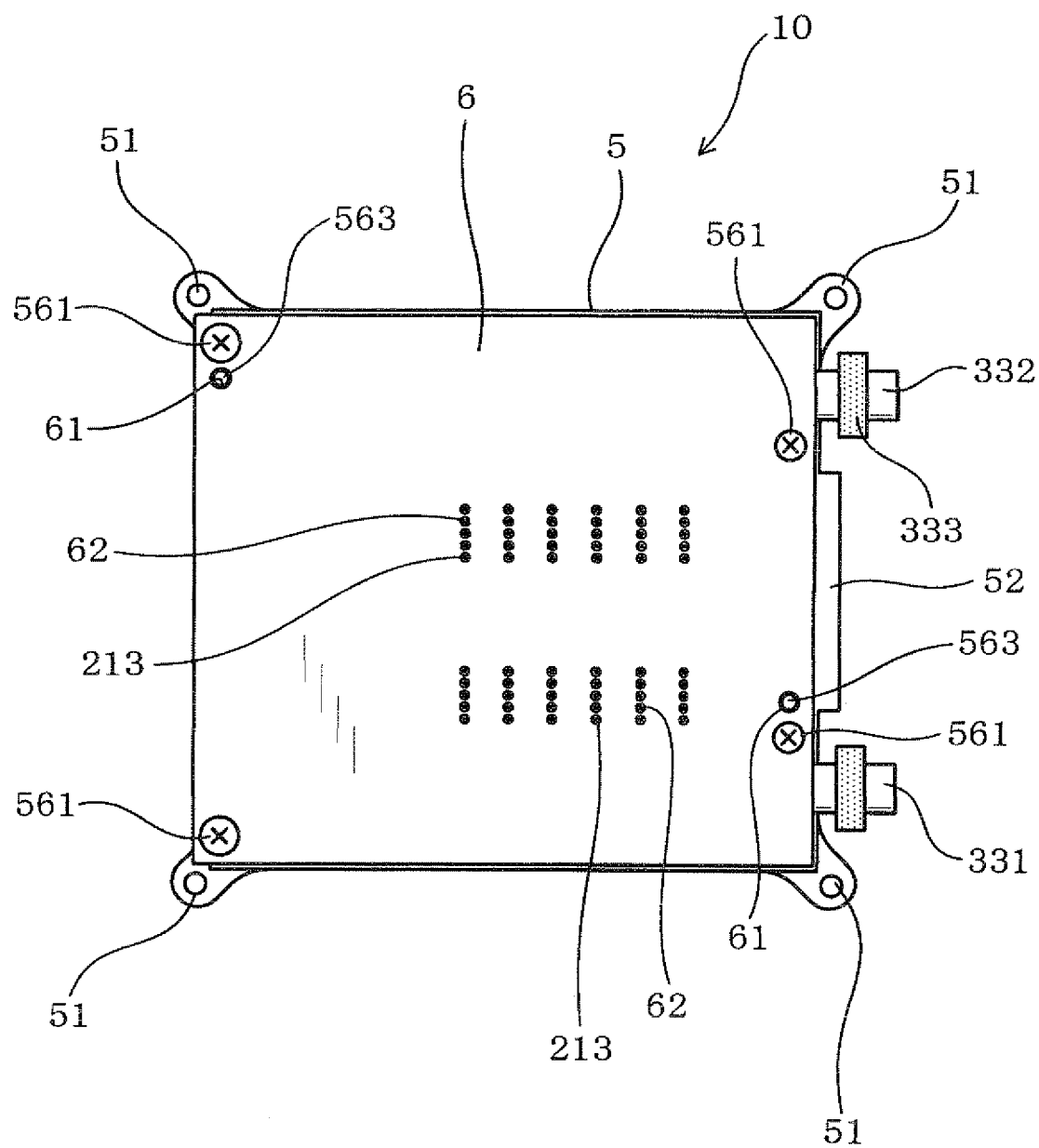
Figure 35:
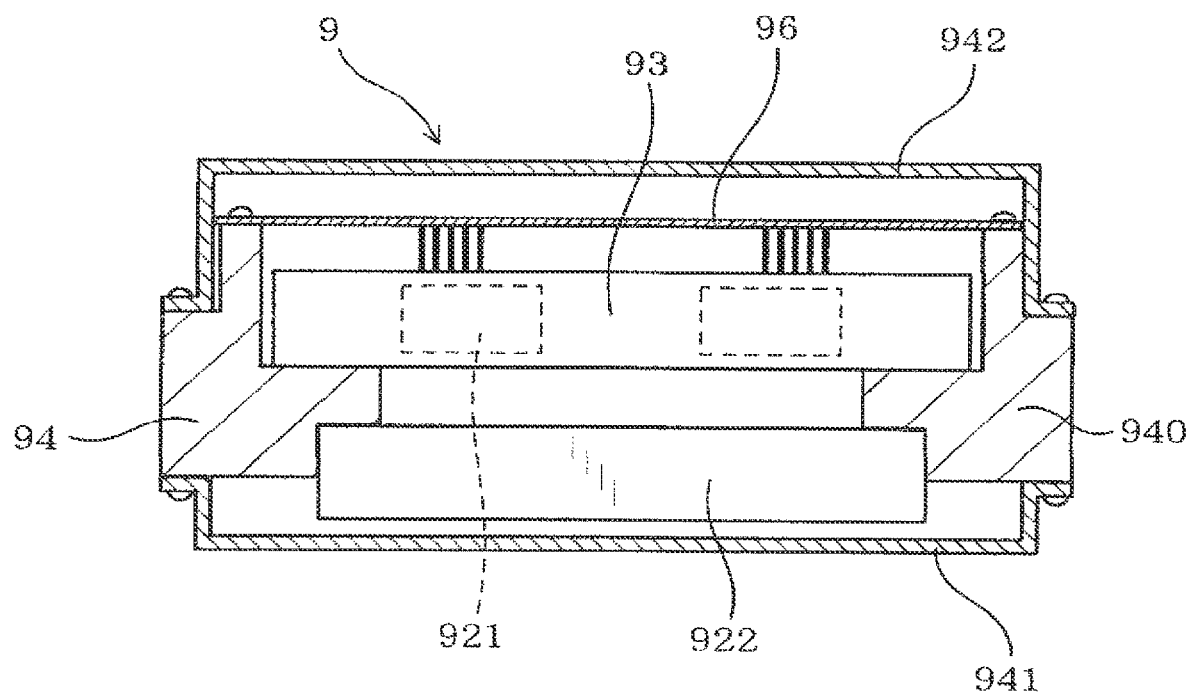
FIG. 35 is a cross sectional view of a conventional power conversion apparatus.

As shown in FIG. 34, the unit fixing sections 51 are formed in the frame 5 so as to project outward respectively from the four corners of the frame 5, and be located outward of the outer edge of the control circuit board 6. As shown in FIG. 27, the board fixing sections 56 are located more inward than the unit fixing sections 51. The components of this embodiment are the same as those of the first embodiment except for the above.

In this embodiment, the frame 5 includes the positioning pins 563. This makes it possible to position the control circuit board 6 with respect to the semiconductor modules 21, and accordingly, to make a reliable connection between the semiconductor modules 21 and the control circuit board 6. As shown in FIG. 29, the tips 564 of the positioning pins 563 are located closer to the frame 5 in the height direction Z than the tips of the control terminals 213. This facilitates the work to insert the control terminals 213 of the semiconductor modules 21 into the through holes 62 (see FIG. 28) formed in the control circuit board 6 to fix the control circuit board 6 to the board fixing sections 56. This is because, it is exceedingly difficult to insert the control terminals 213 into the through holes 62 of the control circuit board 6 after the positioning pins 563 are inserted into the positioning holes 61.

Figure 30:
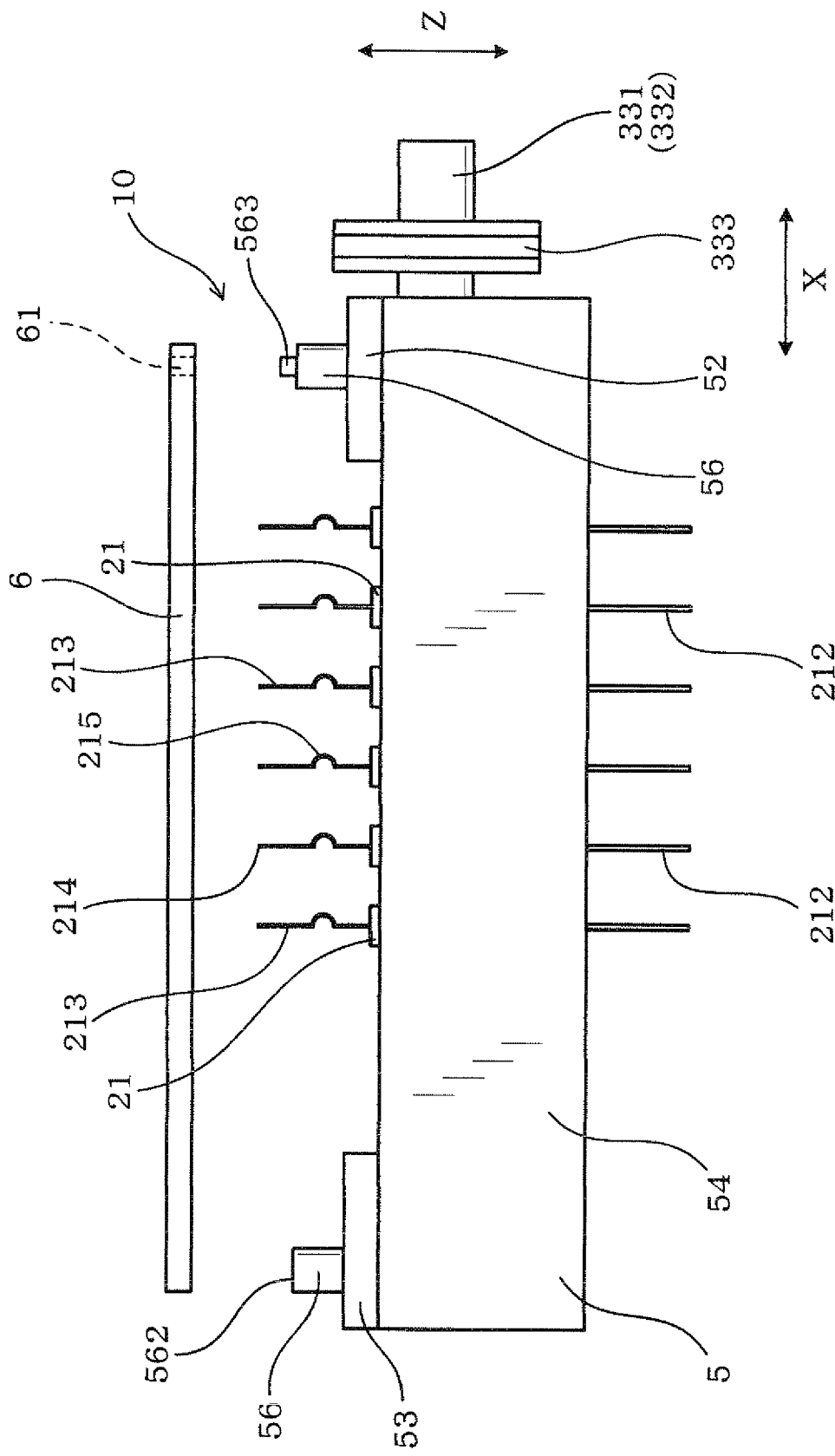
FIG. 30 is an explanatory side view showing the internal unit in a state where the control circuit board is placed above the internal unit during assembly of the power conversion apparatus according to the third embodiment.
Figure 31:
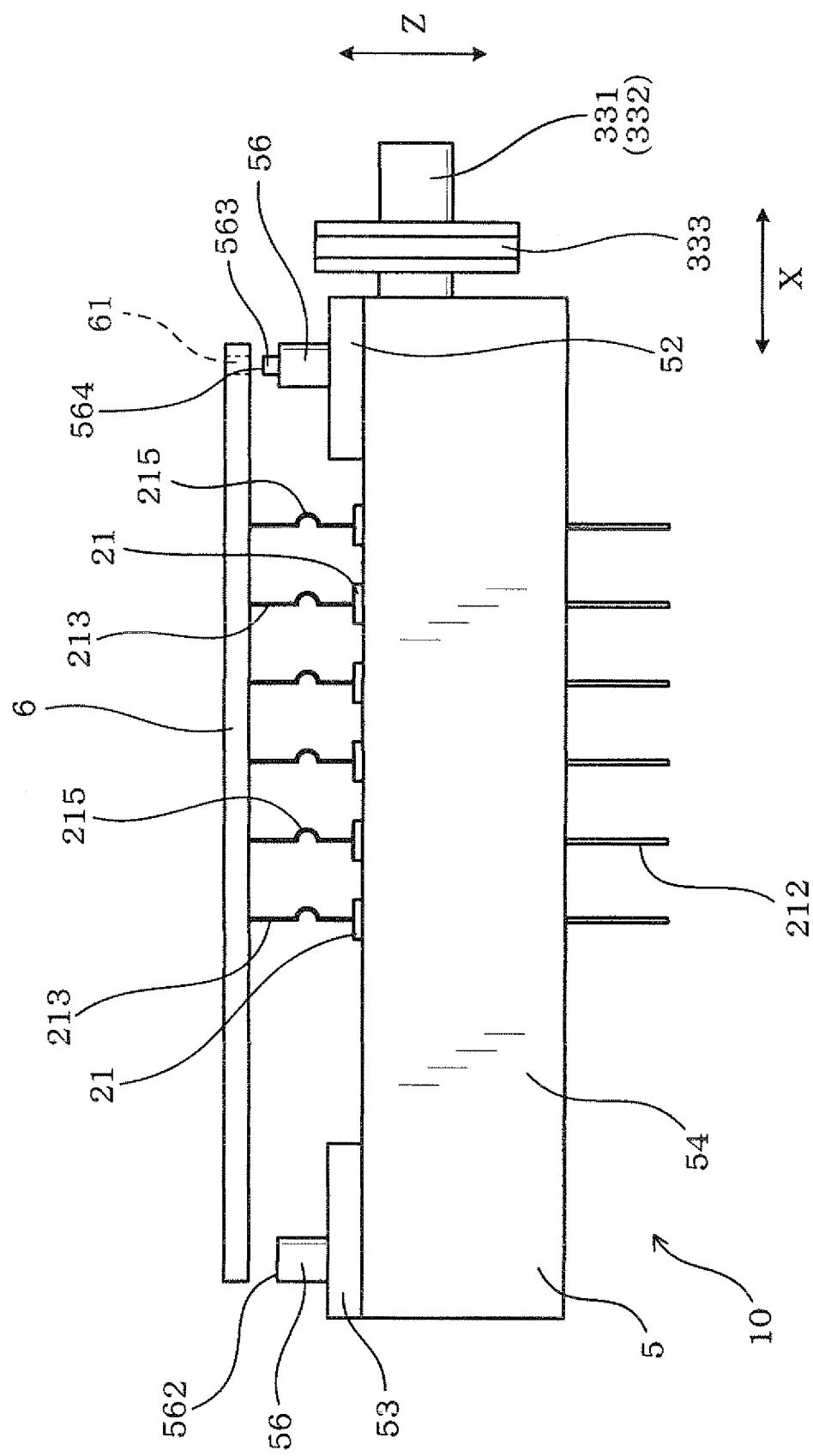
FIG. 31 is an explanatory side view showing the internal unit in a state where only the tips of control terminals of semiconductor modules are inserted into through holes of the control circuit board placed above the internal unit during assembly of the power conversion apparatus according to the third embodiment.

More specifically, to assemble the control circuit board 6 to the internal unit 10, the control circuit board 6 is placed above the internal unit 10 in the height direction Z as shown in FIG. 30. Thereafter, as shown in FIG. 31, the control circuit board 6 is brought down such that only the tips of the control terminals 213 projecting upward of the semiconductor modules 21 are respectively inserted into the through holes 62 of the control circuit board 6. At this time, the positioning pins 563 are not inserted into the positioning holes 61 of the control circuit board 6.

Figure 32:
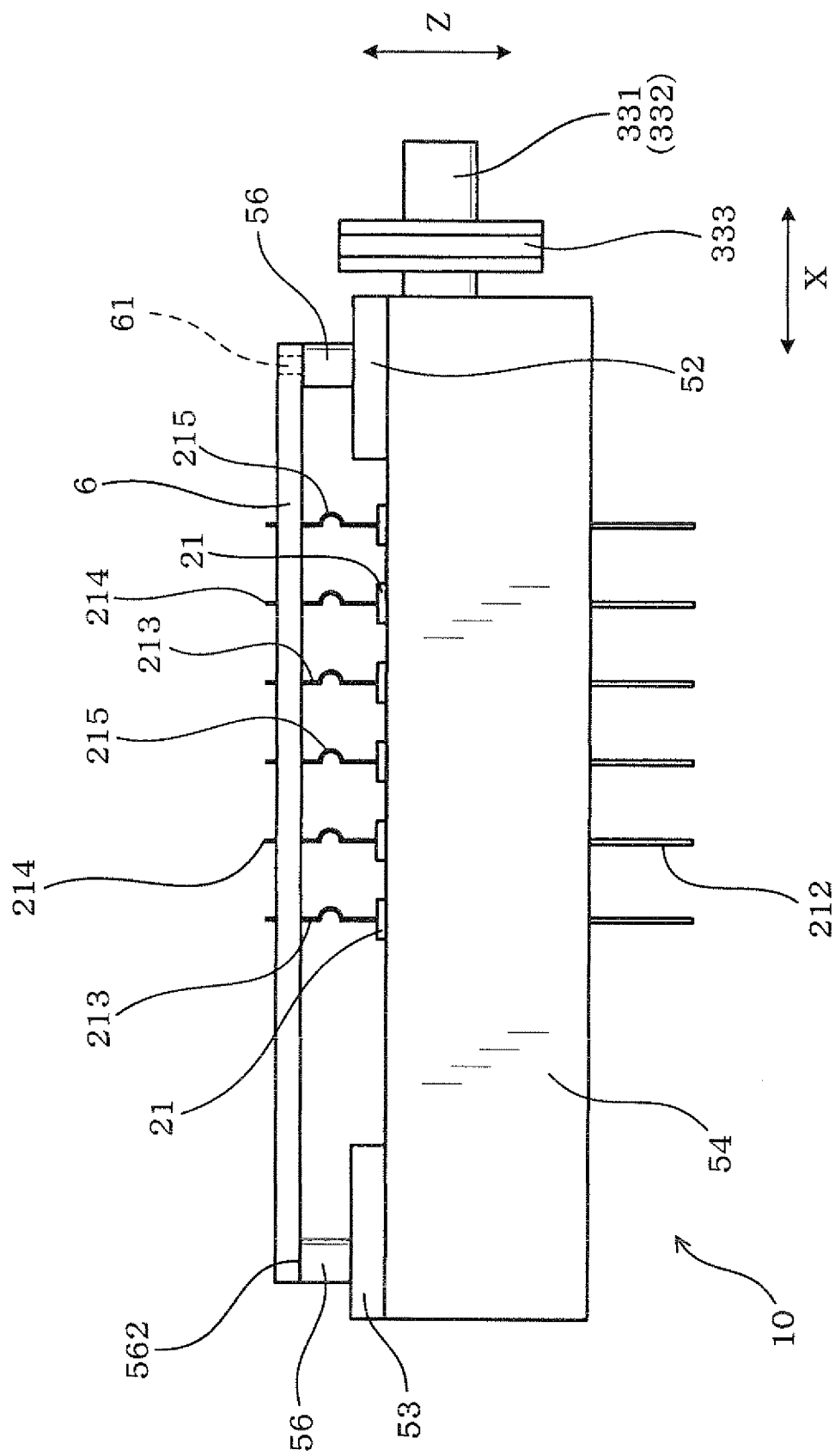
FIG. 32 is an explanatory side view showing the internal unit when the control circuit board is moved for proper positioning thereof in the state where the control terminals are inserted into the through holes during assembly of the power conversion apparatus according to the third embodiment.
Figure 33:
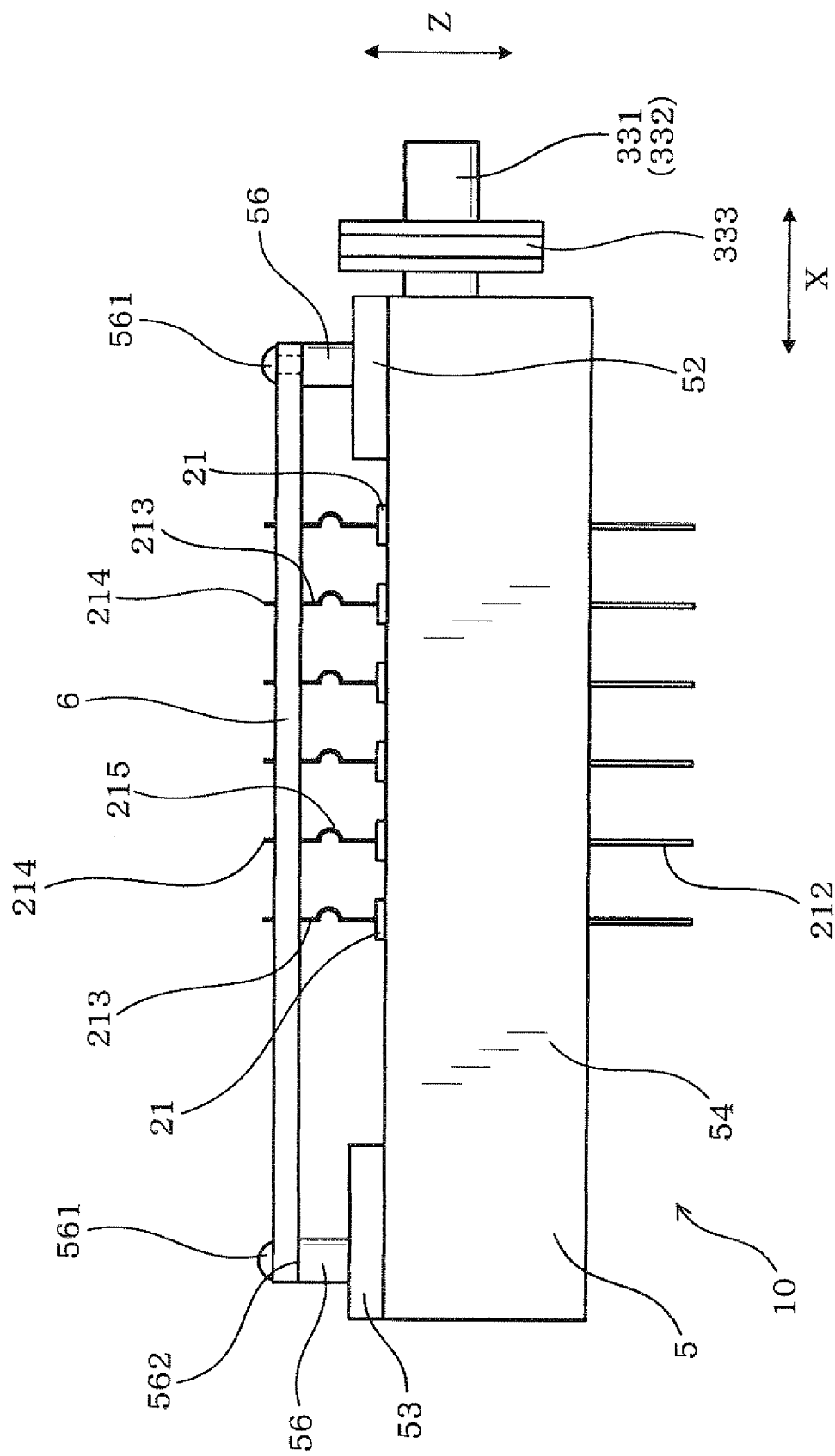
FIG. 33 is a side view of the internal unit assembled with the control circuit board of the third embodiment.

Next, as shown in FIG. 32, the control circuit board 6 is moved in the stacking direction X with respect to the internal unit 10. At this time, the control terminals 213 follows the movement of the control circuit board 6 by bending mainly at their bent portions 215 in the stacking direction X. By the movements of the control circuit board 6 and the control terminals, all the control terminals 213 are well positioned with respect to the through holes 62 of the control circuit board 6, and all the control terminals 213 are inserted into the corresponding through holes 62. When the control circuit board 6 abuts on the board abutment surfaces 562 of the four board fixing sections 56, the control circuit board 6 is secured to the four board fixing sections 56 by the screws 561. This completes fixing the control circuit board 6 to the internal unit 10.

To perform such an assembling procedure, as shown in FIG. 29, the tips 564 of the positioning pins 563 are located at positions closer to the frame 5 in the height direction Z than the tips 214 of the control terminals 213. This makes it possible to insert the control terminals 213 to the through holes 62 of the control circuit board 6 before the positioning pins 563 are inserted into the positioning holes 61, as shown in FIG. 31. This facilitates assembling the control circuit board 6 to the internal unit 10.

As shown in FIG. 27, the board fixing sections 56 formed in the front wall section 52 is located between the coolant introduction tube 331 and the coolant discharge tube 332. This makes it possible to reduce the outer dimensions of the control circuit board 6 and the frame 5. This is because if the board fixing sections 56 formed in the front wall section 52 are located outward of the coolant introduction tube 331 and the coolant discharge tube 332, the outer dimensions of the control circuit board 6 to be fixed to the board fixing sections 56 have to be increased, and accordingly also the outer dimensions of the frame 5 have to be increased.

In more detail, since the coolant introduction tube 331 and the coolant discharge tube 332 are fixed to the front wall section 52 by the clamp members 16, it is necessary to avoid interference between the clamp members 16 and the board fixing sections 56. The clamp sections 16 are fixed to the front wall section 52 at positions outward of the coolant introduction tube 331 and the coolant discharge tube 332 by the bolts 161. Accordingly, if the board fixing sections 56 formed in the front wall section 52 are located outward of the coolant introduction tube 331 and the coolant discharge tube 332, since the distance between the paired board fixing sections 56 becomes large significantly, as a result of which the outer dimensions of the control circuit board 6 and the frame 5 have to be increased. Accordingly, in this embodiment, the board fixing sections 56 are located between the coolant introduction tube 331 and the coolant discharge tube 332 in order to prevent the outer dimensions of the control circuit board 6 and the frame 5 from being increased to thereby make the power conversion apparatus 1 compact in size. Other than the above, this embodiment provides the same advantages as those provided by the first embodiment.

In the above embodiments, the internal unit 10 includes the stacked body 11 of the cooling tubes 31 and the semiconductor modules 21 which are stacked alternately, however, the present invention is also applicable to a power conversion apparatus in which at least some of the electronic components such as semiconductor modules are fixed to the internal unit thereof. In this case, the board abutment surfaces of the board fixing sections do not necessary have to be located at positions closer to the frame in the height direction than the tips of the control terminals. They may be located at positions more distant from the frame in the height direction than the tips of the control terminals.

In the above embodiments, the cooler is constituted as the stacked body of the cooling tubes and the semiconductor modules. However, the present invention is also applicable to a power conversion apparatus including a cooling structure in which a semiconductor element, a metal body thermally coupled to this semiconductor element and a sealing member are integrated as a sealed semiconductor-integrated cooling structure having a coolant channel allowing coolant to flow toward the metal body, and a plurality of such sealed semiconductor-integrated cooling structures are stacked such that the sealed semiconductor-integrated cooling structures and coolant passages alternate in the stacking direction.

In the above embodiments, the pressure member is disposed between the rear wall section and the rear end of the stacked body. However, the pressure member may be disposed between the front wall section and the front end of the stacked body. In this case, when the coolant introduction tube and the coolant discharge tube are disposed side by side protruding from the front wall section, the pressure member may be disposed between the front wall section and the front end of the stacked body so as to be located between the coolant introduction tube and the coolant discharge tube.

The above explained preferred embodiments are exemplary of the invention of the present application which is described solely by the claims appended below. It should be understood that modifications of the preferred embodiments may be made as would occur to one of skill in the art.

What is claimed is:

1. A power conversion apparatus comprising:
   electronic components constituting a power conversion circuit;
   a cooler for cooling at least some of the electronic components;
   a case housing the electronic components and the cooler; and
   a frame attached to an interior of the case;
   wherein
   the at least some of the electronic components and the cooler are fixed to and integrated with the frame to form an internal unit,
   the internal unit is fixed within the case through the frame,
   the frame has such a shape that at least some of the electronic components constituting the internal unit are disposed inside the frame and such that the frame surrounds the at least some of the electronic components and the cooler on at least four sides,
   the internal unit includes, as the at least some of the electronic components constituting the internal unit disposed inside the frame, semiconductor modules each incorporating switching elements and provided with control terminals through which control currents to control the switching elements are inputted and a control circuit board for generating the control currents,
   the cooler includes therein coolant passages,
   the internal unit further includes a stacked body of the coolant passages and the semiconductor modules,
   the coolant passages and the semiconductor modules being stacked alternately in the stacked body in a stacking direction parallel to a plane of the frame,
   the control terminals have a shape projecting in a height direction perpendicular to the stacking direction and the plane of the frame,
   the frame is provided with board fixing sections to which the control circuit board is fixed, the board fixing sections projecting in a direction of projection of the control terminals, and
   each of the board fixing sections has a board abutment surface for abutment with the control circuit board at a position closer to the frame in the height direction than tips of the control terminals.

2. The power conversion apparatus according to claim 1, wherein the frame is provided with positioning pins each projecting from the board abutment surface of a corresponding one of the board fixing sections and inserted into a corresponding one of positioning holes formed in the board circuit board, tips of the positioning pins being located at positions closer to the frame in the height direction than the tips of the control terminals.

3. The power conversion apparatus according to claim 1, wherein the frame includes unit fixing sections for fixing the internal unit to the case, the unit fixing sections being located outward of an outer edge of the control circuit board.

4. The power conversion apparatus according to claim 3, wherein the board fixing sections are located more inward than the unit fixing sections.

5. The power conversion apparatus according to claim 1, wherein the cooler includes a coolant introduction tube for introducing coolant into the coolant passages and a coolant discharge tube for discharging the coolant from the coolant passages, each of the coolant introduction tube and the coolant discharge tube projecting from one end of the stacked body in the stacking direction and protruding outward from the frame and the case, the frame includes a front wall section located opposite to the one end of the stacked body in the stacking direction, a rear wall section located opposite to other end of the stacked body in the stacking direction, and a pair of side wall sections connecting the front and rear wall sections together at both ends of the front and rear wall sections, and at least one of the board fixing sections is formed in the front wall section so as to be located between the coolant introduction tube and the coolant discharge tube.

6. The power conversion apparatus according to claim 1, wherein the cooling passages are formed by cooling tubes.

7. The power conversion apparatus according to claim 1, wherein the frame and the internal unit are removably attached to an interior of the case.

* * * * *